(12) United States Patent
Hirano et al.

(10) Patent No.: US 10,056,230 B2
(45) Date of Patent: Aug. 21, 2018

(54) POWER SUPPLY SYSTEM, PLASMA PROCESSING APPARATUS AND POWER SUPPLY CONTROL METHOD

(71) Applicant: Tokyo Electron Limited, Tokyo (JP)

(72) Inventors: Taichi Hirano, Miyagi (JP); Junji Ishibashi, Miyagi (JP); Keiki Ito, Miyagi (JP); Kunihiro Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 317 days.

(21) Appl. No.: 15/075,505

(22) Filed: Mar. 21, 2016

(65) Prior Publication Data

US 2016/0284514 A1    Sep. 29, 2016

(30) Foreign Application Priority Data

Mar. 23, 2015    (JP) .................................. 2015-059693

(51) Int. Cl.

| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01J 37/32* | (2006.01) |

(52) U.S. Cl.
CPC .. *H01J 37/32091* (2013.01); *H01J 37/32146* (2013.01); *H01J 37/32174* (2013.01); *H01J 37/32577* (2013.01)

(58) Field of Classification Search
USPC .......................................................... 216/67
See application file for complete search history.

(56) References Cited

U.S. PATENT DOCUMENTS

| | | |
|---|---|---|
| 7,692,916 B2 | 4/2010 | Matsumoto |
| 2005/0142873 A1 | 6/2005 | Shindo et al. |
| 2006/0037703 A1 | 2/2006 | Koshiishi et al. |
| 2007/0029194 A1 | 2/2007 | Matsumoto et al. |
| 2010/0213162 A1 | 8/2010 | Mochiki et al. |
| 2014/0231389 A1 | 8/2014 | Nagami et al. |

(Continued)

FOREIGN PATENT DOCUMENTS

| | | |
|---|---|---|
| CN | 1842242 A | 10/2006 |
| CN | 102157372 A | 8/2011 |

(Continued)

*Primary Examiner* — Roberts Culbert
(74) *Attorney, Agent, or Firm* — Pearne & Gordon LLP

(57) ABSTRACT

A power supply system includes a high frequency power supply which supplies a high frequency power; a DC power supply which supplies a first negative DC voltage or a second negative DC voltage having an absolute value larger than that of the first DC voltage; and a control unit which performs a power supply control process of repeating a supply and a stop of the supply of the high frequency power alternately; stopping supplies of the first and second DC voltages for a first period, which is a time period from a beginning of the supply of the high frequency power within a period during which the high frequency power is being supplied; supplying the first DC voltage for a second period except the first period within the period; and supplying the second DC voltage for a period during which the supply of the high frequency power is stopped.

9 Claims, 12 Drawing Sheets

(56) References Cited

U.S. PATENT DOCUMENTS

| | | |
|---|---|---|
| 2014/0326409 A1 | 11/2014 | Koshiishi |
| 2014/0363977 A1 | 12/2014 | Morimoto et al. |
| 2015/0000842 A1* | 1/2015 | Hirano .................. G05B 11/01 156/345.28 |
| 2016/0233057 A1 | 8/2016 | Morimoto |

FOREIGN PATENT DOCUMENTS

| | | |
|---|---|---|
| CN | 104241071 A | 12/2014 |
| JP | 2010-219491 A | 9/2010 |
| JP | 2011-103489 A | 5/2011 |
| TW | 201340167 | 10/2013 |

* cited by examiner

FIG. 8A
| FILM TYPE | ON TIME (us) | DELAY TIME (us) | VOLTAGE STOP PERIOD RATIO (%) | E/R[nm/min] | E/R REDUCTION RATIO (%) |
|---|---|---|---|---|---|
| Poly | 60 | 0 | 0 | 28 | 0 |
| Poly | 60 | 10 | 17 | 27.5 | 1.79 |
| Poly | 60 | 15 | 25 | 27 | 3.57 |
| Ox | 60 | 0 | 0 | 585.9 | 0 |
| Ox | 60 | 10 | 17 | 575.1 | 1.84 |
| Ox | 60 | 15 | 25 | 566.3 | 3.35 |
FIG. 8B
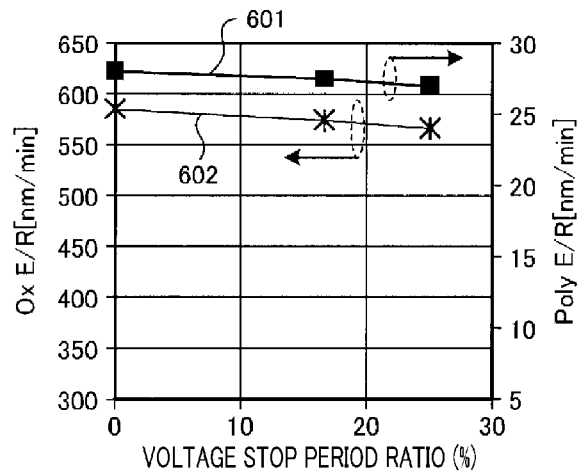
FIG. 8C
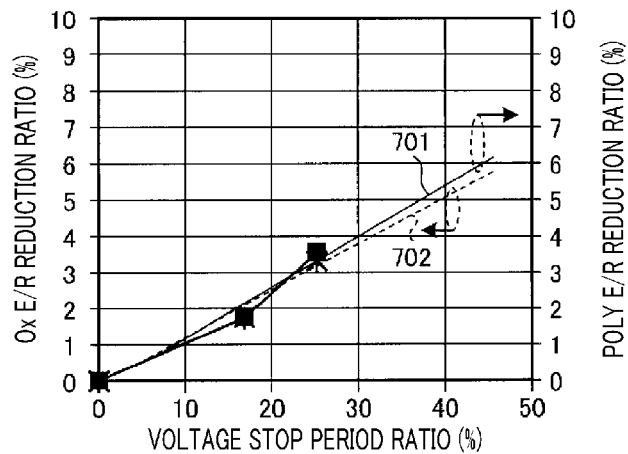

FIG. 9

DC On delay 15us

LF12kW

| Frequency | Duty | | | | |
|---|---|---|---|---|---|
| | 20% | 30% | 40% | 50% | 60% |
| 4kHz | | | ○ | | |
| 5kHz | ○ | | | | |
| 10kHz | | | ○ | | ○ |

LF15kW

| Frequency | Duty | | | | |
|---|---|---|---|---|---|
| | 20% | 30% | 40% | 50% | 60% |
| 4kHz | | | ○ | | |
| 5kHz | ○ | | | | |
| 10kHz | | | ○ | | ○ |

STD DC POWER SUPPLY

LF12kW

| Frequency | Duty | | | | |
|---|---|---|---|---|---|
| | 20% | 30% | 40% | 50% | 60% |
| 4kHz | | | × | | |
| 5kHz | × | | | | |
| 10kHz | | | | | ○ |

LF15kW

| Frequency | Duty | | | | |
|---|---|---|---|---|---|
| | 20% | 30% | 40% | 50% | 60% |
| 4kHz | | | × | | |
| 5kHz | × | | × | | × |
| 10kHz | | | | | × |

POWER SUPPLY SYSTEM, PLASMA PROCESSING APPARATUS AND POWER SUPPLY CONTROL METHOD

CROSS-REFERENCE TO RELATED APPLICATION

This application claims the benefit of Japanese Patent Application No. 2015-059693 filed on Mar. 23, 2015, the entire disclosures of which are incorporated herein by reference.

TECHNICAL FIELD

The embodiments described herein pertain generally to a power supply system, a plasma processing apparatus, and a power supply control method.

BACKGROUND

In a manufacturing process of a semiconductor device, as a plasma processing apparatus for processing a processing target object such as a semiconductor wafer, there is known a plasma etching apparatus which is configured to perform an etching process on the processing target object by irradiating plasma to the processing target object. For example, a capacitively coupled parallel plate type plasma etching apparatus is widely utilized as the plasma etching apparatus.

In the capacitively coupled parallel plate type plasma etching apparatus, a pair of parallel plate electrodes (i.e., an upper electrode and a lower electrode) is provided within a processing vessel, for example. The processing target object is placed on the lower electrode. By supplying a processing gas into the processing vessel and applying a high frequency power to the upper electrode or the lower electrode, plasma is generated within a space between the upper electrode and the lower electrode, and etching is performed on the processing target object placed on the lower electrode with the generated plasma.

Recently, in the manufacturing process of the semiconductor device, it is required to form a hole having a higher aspect ratio by processing the processing target object. As commonly known in the art, however, if the aspect ratio is increased, positive ions are collected in a bottom portion of the hole, and straightness of the positive ions within the hole is deteriorated. As a result, it is difficult to obtain a desirable etching shape.

As a resolution to this problem, in order to electrically neutralize the positive ions collected in the bottom portion of the hole, there is proposed a method of applying a negative DC voltage to the upper electrode to accelerate electrons emitted from the upper electrode toward the processing target object and supply the accelerated electrons into the bottom portion of the hole.

The neutralization of the positive ions by the supply of the electrons, however, may be hindered by a plasma sheath generated on the processing target object. That is, since the supply of the high frequency power to the lower electrode accompanies generation of the plasma sheath on the processing target object, the electrons may be bounced off the plasma sheath and may not reach the bottom portion of the hole. As a consequence, the positive ions may not be sufficiently neutralized by the supply of the electrons.

Accordingly, there is proposed a plasma etching apparatus in which a supply amount of electrons is further increased. In this plasma etching apparatus, by turning on and off a high frequency power supply on a preset cycle, a supply of a high frequency power for plasma generation to the lower electrode and a stop of the supply of this high frequency power are alternately repeated. Further, in this plasma etching apparatus, a negative DC voltage having a relatively small absolute value is supplied to the upper electrode for a time period during which the high frequency power is being supplied, and a negative DC voltage having a relatively large absolute value is supplied to the upper electrode for a time period during which the supply of the high frequency power is stopped. Here, for the time period during which the supply of the high frequency power is stopped, the plasma extinguishes, and, thus, the plasma sheath on the processing target object is reduced or extinguished. In this time period, since the negative DC voltage having the relatively large absolute value is supplied to the upper electrode, a larger number of electrons is supplied into the bottom portion of the hole in the state that the plasma sheath on the processing target object is reduced or extinguished. Accordingly, the positive ions collected in the bottom portion of the hole can be efficiently neutralized.

Patent Document 1: Japanese Patent Laid-open Publication No. 2010-219491

In the prior art, however, it is not considered to suppress an electric discharge which may occur at the upper electrode side due to the bouncing of the electrons off the plasma sheath which is generated on the plasma processing object when the high frequency power is supplied to the lower electrode.

That is, in the prior art, for the time period during which the supply of the high frequency power is stopped, the negative DC voltage having the relatively large absolute value is supplied to the upper electrode, and if the supply of the high frequency power is resumed, the negative DC voltage having the relatively small absolute value is supplied to the upper electrode concurrently with the beginning of the re-supply of the high frequency power. Accordingly, in the prior art, in the state that the plasma sheath generated on the processing target object, which is accompanied by the supply of the high frequency power to the lower electrode, is not fully grown, the electrons emitted from the upper electrode are accelerated toward the processing target object by supplying the negative DC voltage to the upper electrode. Accordingly, the accelerated electrons are bounced off in a direction approaching the upper electrode by the plasma sheath which is being grown in a direction away from the processing target object, i.e., in the direction approaching the upper electrode. As a result, in the prior art, the electric discharge may occur at the upper electrode side due to the bounced electrons.

SUMMARY

In one exemplary embodiment, a power supply system includes a first high frequency power supply configured to supply a high frequency power for plasma generation to a lower electrode configured to mount a processing target object thereon; a DC power supply configured to supply a first negative DC voltage or a second negative DC voltage having an absolute value larger than that of the first DC voltage to an upper electrode provided to face the lower electrode; and a control unit configured to perform a power supply control process of repeating a supply of the high frequency power and a stop of the supply of the high frequency power alternately; stopping a supply of the first DC voltage and a supply of the second DC voltage for a first period, which is a time period from a beginning of the supply of the high frequency power within a period during which the high frequency power is being supplied; supplying the first DC voltage for a second period except the first period within the period during which the high frequency power is being supplied; and supplying the second DC voltage for a period during which the supply of the high frequency power is stopped.

According to the exemplary embodiments, it is possible to provide a power supply system, a plasma processing apparatus and a power supply control method capable of suppressing an occurrence of an electric discharge at an upper electrode side, which is caused by electrons bounced off a plasma sheath generated on a processing target object when a high frequency power is supplied to a lower electrode.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A is a diagram showing an example of experimental results showing a relationship between the candidate periods as the candidates of the voltage stop period A1*a* and an etching rate reduction ratio corresponding to each of the candidate periods;

FIG. 8B is a diagram for describing a relationship between an etching rate and a voltage stop period ratio shown in FIG. 8A;

FIG. 8C is a diagram for describing a relationship between the etching rate reduction ratio and the voltage stop period ratio shown in FIG. 8A;

FIG. 9 is a diagram showing an example of presence or absence of an electric discharge in case of varying a second high frequency power in the power supply control process according to the exemplary embodiment;

DETAILED DESCRIPTION

Figure 1:
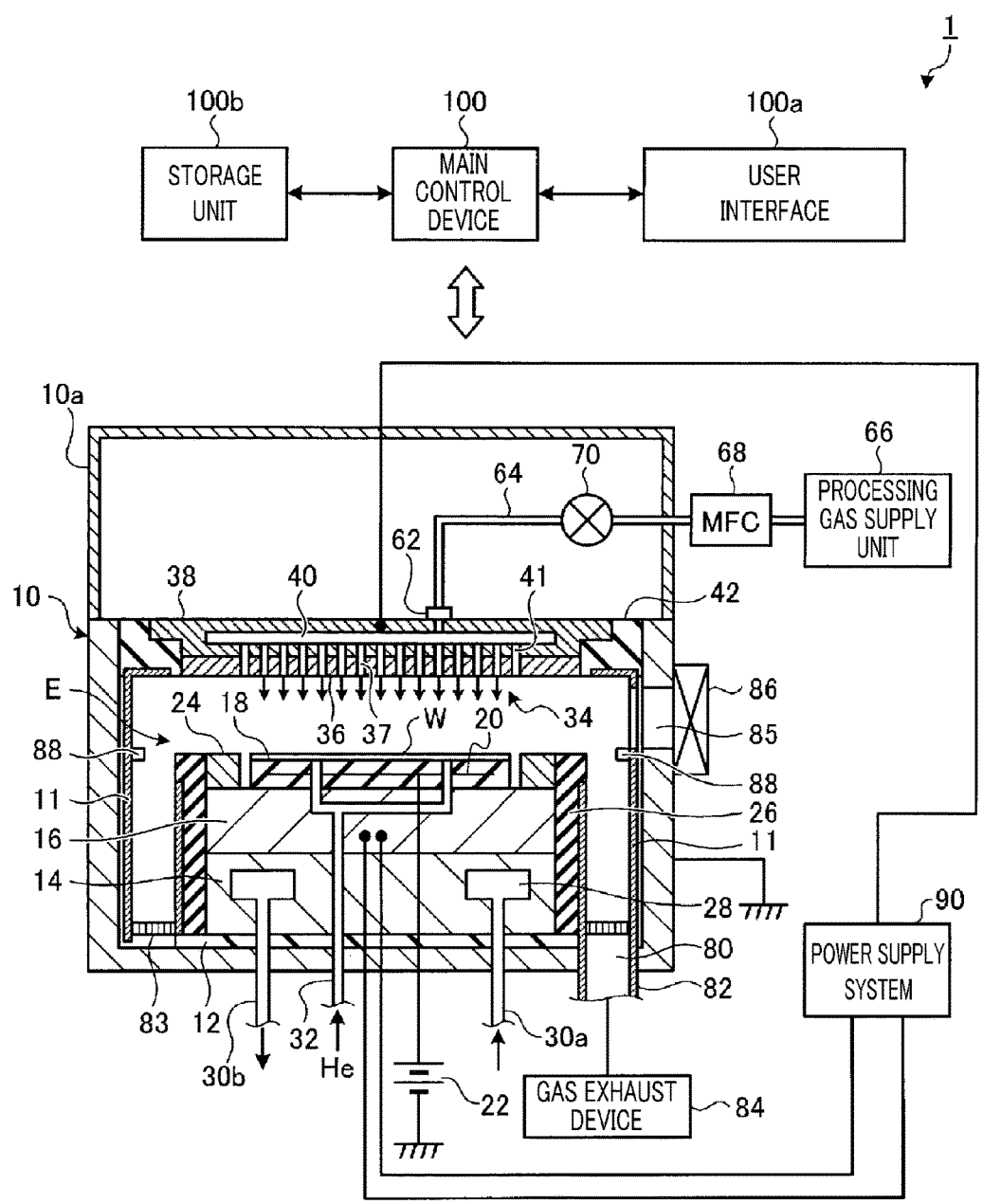
FIG. 1 is a cross sectional view schematically illustrating a plasma etching apparatus equipped with a power supply system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a cross sectional view schematically illustrating a plasma etching apparatus equipped with a power supply system according to an exemplary embodiment. The plasma etching apparatus 1 shown in FIG. 1 is configured as a capacitively coupled parallel plate type plasma etching apparatus, and includes a substantially cylindrical processing vessel 10. The processing vessel 10 is formed of, for example, aluminum having an anodically oxidized surface. This processing vessel 10 is frame-grounded.

An insulating plate 12 made of ceramics or the like is provided on a bottom portion of the processing vessel 10, and a cylindrical susceptor supporting table 14 is disposed on the insulating plate 12. A lower electrode 16, which is made of, for example, aluminum and serves as a susceptor, is provided on the susceptor supporting table 14. In the exemplary embodiment, the lower electrode 16 forms a mounting table configured to mount thereon a semiconductor wafer W as a processing target object. In the plasma etching apparatus 1, a cylindrical inner wall member 26 is provided on a side surface of the susceptor supporting table 14 and a side surface of the lower electrode 16. The inner wall member 26 is made of, but not limited to, quartz.

An electrostatic chuck 18 configured to attract and hold the semiconductor wafer W by an electrostatic force is provided on a top surface of the lower electrode 16. The electrostatic chuck 18 includes a pair of insulating layers or insulating sheets; and an electrode 20, as a conductive film, embedded therebetween. The electrode 20 is electrically connected to a DC power supply 22. The electrostatic chuck 18 is capable of attracting and holding the semiconductor wafer W by the electrostatic force such as a Coulomb force generated by a DC voltage applied from the DC power supply 22.

A focus ring (calibration ring) 24 is provided on the top surface of the lower electrode 16 to surround the electrostatic chuck 18. The focus ring 24 has conductivity and is made of, for example, silicon. The focus ring 24 is configured to improve etching uniformity.

A coolant path 28 is provided within the susceptor supporting table 14. A coolant of a preset temperature, for example, cooling water is supplied into and circulated through the coolant path 28 from an external chiller unit via a pipe 30a and a pipe 30b. By controlling the temperature of the coolant circulated in this way, a temperature of the semiconductor wafer W mounted on the lower electrode 16 is controlled.

Further, the plasma etching apparatus 1 is further equipped with a gas supply line 32. The gas supply line 32 is configured to supply a heat transfer gas such as, but not limited to, a He gas from a heat transfer supply device into a gap between a top surface of the electrostatic chuck 18 and a rear surface of the semiconductor wafer W.

An upper electrode 34 is provided above the lower electrode 16, facing the lower electrode 16. The lower electrode 16 and the upper electrode 34 are arranged to be substantially parallel to each other. Formed between the upper electrode 34 and the lower electrode 16 is a processing space E in which a plasma etching process is performed on the semiconductor wafer W as the processing target object. The upper electrode 34 forms a surface, i.e., a facing surface, which faces the semiconductor wafer W on the lower electrode 16 while being in contact with the processing space E as a plasma generation space.

The upper electrode 34 is supported at an upper portion of the processing vessel 10 with an insulating shield member 42 therebetween. The upper electrode 34 may include an electrode plate 36 and an electrode supporting body 38. The electrode plate 36 forms the facing surface with respect to the lower electrode 16, and is provided with a multiple number of gas discharge holes 37. The electrode plate 36 may be made of a conductor or a semiconductor having low Joule heat and low resistance. As will be discussed later, for the purposes of enhancing a resist, the electrode plate 36 may be made of silicon or a silicon-containing material such as SiC.

The electrode supporting body 38 is configured to support the electrode plate 36 in a detachable manner, and is made of a conductive material such as, but not limited to, aluminum. The electrode supporting body 38 may have a water-cooling structure. A gas diffusion space 40 is formed within the electrode supporting body 38. A multiple number of gas through holes 41 is extended downwards from the gas diffusion space 40, and these gas through holes 41 respectively communicate with the gas discharge holes 37. Further, the electrode supporting body 38 is also provided with a gas inlet opening 62 through which a processing gas is introduced into the gas diffusion space 40, and this gas inlet opening 62 is connected to a gas supply line 64.

The gas supply line 64 is connected to a processing gas supply unit 66. The gas supply line 64 is equipped with a mass flow controller (MFC) 68 and an opening/closing valve 70 provided in sequence from the upstream side. Instead of the MFC, a FCS may be provided. The processing gas supply unit 66 is configured to supply a gas containing a fluorocarbon gas $C_xF_y$ such as $C_4F_8$ gas as a processing gas for etching. The processing gas supplied from the processing gas supply unit 66 reaches the gas diffusion space 40 through the gas supply line 64 and is discharged into the processing space E through the gas thorough holes 41 and the gas discharge holes 37. That is, the upper electrode 34 serves as a shower head configured to supply the processing gas.

Further, the plasma etching apparatus 1 may further include a grounding conductor 10a. The grounding conductor 10a has a substantially cylindrical shape and is extended upwards from a side wall of the processing vessel 10 up to a position higher than the upper electrode 34.

The plasma etching apparatus 1 includes a power supply system 90 according to the exemplary embodiment. The power supply system 90 is configured to apply a high frequency power to the lower electrode 16 and apply a DC voltage to the upper electrode 34. This power supply system 90 will be elaborated later.

Further, in the plasma etching apparatus 1, a deposition shield 11 is provided along an inner wall of the processing vessel 10 in a detachable manner. The deposition shield 11 may be also provided on an outer surface of the inner wall member 26. The deposition shield 11 is configured to suppress an etching byproduct (deposit) from adhering to the processing vessel 10, and is formed by coating an aluminum member with ceramics such as $Y_2O_3$.

At a bottom portion of the processing vessel 10, a gas exhaust plate 83 is provided between the inner wall member 26 and the inner wall of the processing vessel 10. The gas exhaust plate 83 may be made of, by way of example, an aluminum member coated with ceramic such as $Y_2O_3$. The processing vessel 10 is also provided with a gas exhaust opening 80 under the gas exhaust plate 83, and the gas exhaust opening 80 is connected with a gas exhaust device 84 via a gas exhaust line 82. The gas exhaust device 84 includes a vacuum pump such as a turbo molecular pump, and is capable of decompressing the inside of the processing vessel 10 to a required pressure level. Further, a carry-in/out opening 85 for the semiconductor wafer W is formed at a sidewall of the processing vessel 10, and this carry-in/out opening 85 is opened or closed by a gate valve 86.

Further, a conductive member (GND block) 88 is provided at the inner wall of the processing vessel 10. The conductive member 88 is arranged at the inner wall of the processing vessel 10 such that it is located at a position substantially same level as the semiconductor wafer W in a height direction. The conductive member 88 is DC-connected to the ground and has an effect of suppressing an abnormal discharge. Further, the arrangement position of the conductive member 88 may not be limited to the position shown in FIG. 1 as long as it is provided within the plasma generation region. For example, the conductive member 88 may be provided at the side of the lower electrode 16 (for example, around the lower electrode 16), or may be provided in the vicinity of the upper electrode 34 (for example, provided in a ring shape at an outside of the upper electrode 34).

Individual components of the plasma etching apparatus 1, for example, the power supply system, the gas supply system, the driving system, the power supply system 90, and so forth are connected to and controlled by a main control device 100 including a microprocessor (computer). Further, a user interface 100a is connected to the main control device 100, and the user interface 100a includes a keyboard through which an operator inputs a command to manage the plasma etching apparatus 1; a display configured to visually display an operational status of the plasma etching apparatus 1; and so forth.

Further, connected to the main control device 100 is a storage unit 100b having stored thereon a control program for implementing various processes performed in the plasma etching apparatus 1 under the control of the main control device 100, and a program for allowing each component of the plasma etching apparatus 1 to perform a process according to processing conditions, i.e., processing recipes. The processing recipes are stored in a storage medium within the storage unit 100b. The storage medium may be a hard disk or a semiconductor memory, or may be a portable device such as a CD-ROM, a DVD, or a flash memory. Further, the processing recipes may be appropriately transmitted from another apparatus through, e.g., a dedicated line.

Further, a necessary recipe is retrieved from the storage unit 100b and executed by the main control device 100 in response to an instruction from the user interface 100a, so that a desired process is performed in the plasma etching apparatus 1 under the control of the main control device 100.

Figure 2:
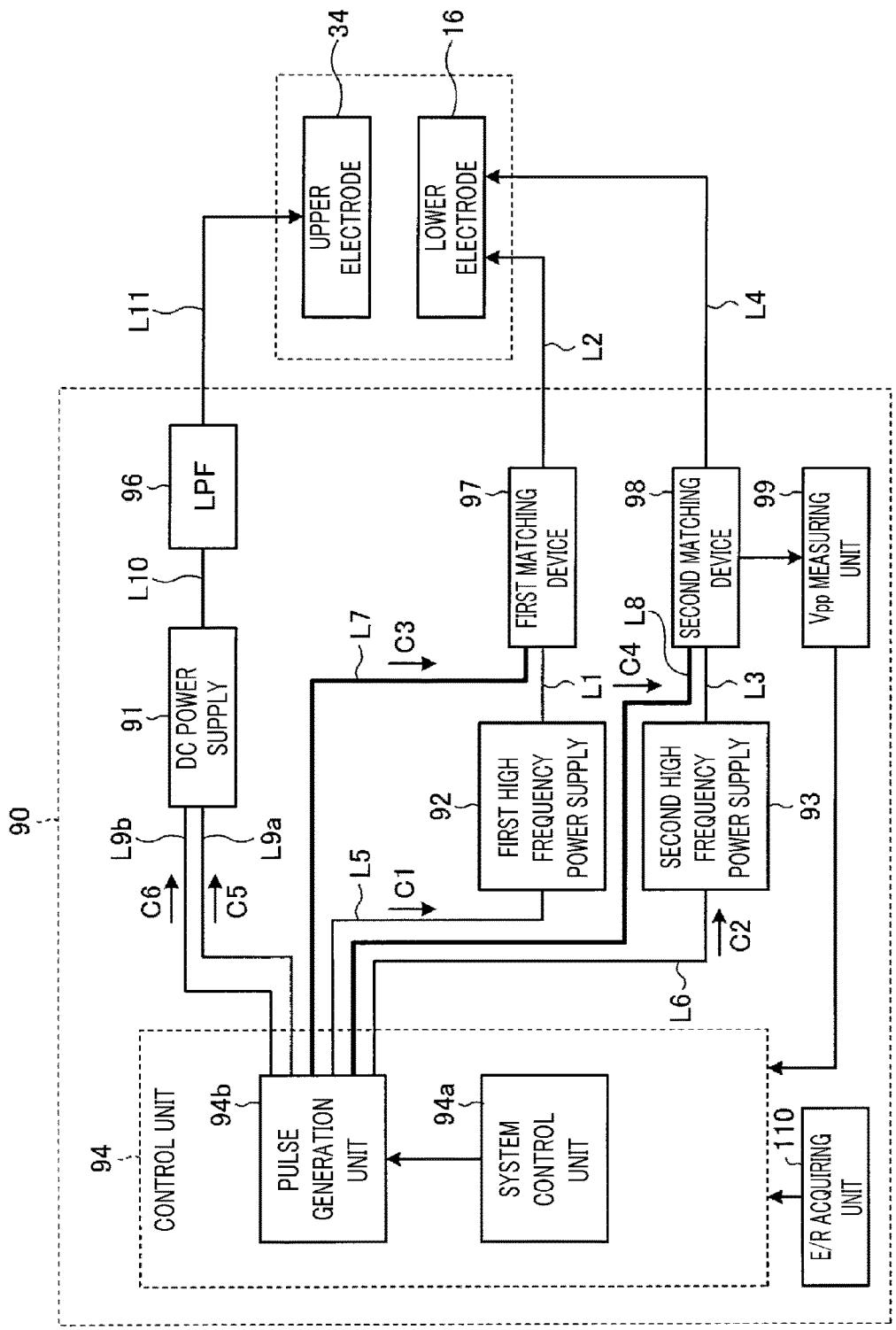
FIG. 2 is a diagram illustrating a configuration of the power supply system according to the exemplary embodiment.

Below, referring to FIG. 2, the power supply system 90 will be described in detail. FIG. 2 is a diagram illustrating a configuration of the power supply system according to the exemplary embodiment. As depicted in FIG. 2, the power supply system 90 includes a DC power supply 91, a first high frequency power supply 92, a second high frequency power supply 93 and a control unit 94. Further, the power supply system 90 also includes a low pass filter (LPF) 96, a first matching device 97 and a second matching device 98. Further, the power supply system 90 further includes a Vpp measuring unit 99 and an etching rate (E/R) acquiring unit 110.

The first high frequency power supply 92 is configured to generate a first high frequency power for plasma generation and output the first high frequency power to the first matching device 97 via a line L1. The first high frequency power output from the first high frequency power supply 92 has a frequency ranging from 27 MHz to 100 MHz, for example, 40 MHz. Further, the first high frequency power supply 92 is connected to the lower electrode 16 via the first matching device 97. The first matching device 97 is configured to match a load impedance with an internal (or output) impedance of the first high frequency power supply 92. The first matching device 97 is configured to match an output impedance of the first high frequency power supply 92 and the load impedance when plasma is generated within the processing vessel 10, and is also configured to output the first high frequency power to the lower electrode 16 via a line L2. The first high frequency power supply 92 is an example of a high frequency power supply configured to supply a high frequency power for plasma generation to the lower electrode 16.

The second high frequency power supply 93 is configured to generate a second high frequency power for ion attraction into the semiconductor wafer W by applying a bias to the semiconductor wafer W, and is also configured to output the second high frequency power to the second matching device 98 via a line L3. The second high frequency power output from the second high frequency power supply 93 has a frequency ranging from 400 kHz to 13.56 MHz, for example, 3 MHz. The second high frequency power supply 93 is connected to the lower electrode 16 via the second matching device 98. The second matching device 98 is configured to match a load impedance with an internal (or output) impedance of the second high frequency power supply 93. The second matching device 98 is configured to match an output impedance of the second high frequency power supply 93 and the load impedance when the plasma is generated within the processing vessel 10, and is also configured to output the second high frequency power to the lower electrode 16 via a line L4. The second high frequency power supply 93 is an example of another high frequency power supply configured to supply a high frequency power for ion attraction to the lower electrode 16.

The DC power supply 91, the high frequency power supplies 92 and 93 and the matching devices 97 and 98 are connected to and controlled by the control unit 94. The control unit 94 includes a storage device having a non-illustrated central processing unit (CPU) and a memory. The control unit 94 reads out and executes a program stored in the storage device in response to a control signal input from the main control device 100, so that a required process is performed in the power supply system 90. For example, the control unit 94 performs a power supply control process for applying a high frequency power to the lower electrode 16 and a DC voltage to the upper electrode 34. For instance, the control unit 94 also performs a first calibration process and a second calibration process of correcting a time period during which the supply of the DC voltage to the upper electrode 34 is stopped. Details of the power supply control process and the first and second calibration processes by the control unit 94 will be described later.

The control unit 94 includes a system control unit 94a and a pulse generation unit 94b. The system control unit 94a is connected to the pulse generation unit 94b. The system control unit 94a is configured to output a signal for generating a pulse signal to the pulse generation unit 94b based on the control signal input from the main control device 100.

The pulse generation unit 94b is connected to the first high frequency power supply 92, the second high frequency power supply 93, the first matching device 97 and the second matching device 98. The pulse generation unit 94b is configured to output several pulse signals each having a preset frequency and a preset duty ratio based on a signal input from the system control unit 94a. Here, an amplitude of a pulse signal has a first level and a second level alternately. Below, the first level is described to be higher than the second level. However, it is also possible that the second level is higher than the first level. Further, in the following description, the first level will be referred to as "H-level," and the second level, "L-level."

The control unit 94 is configured to control on/off operation of the first high frequency power supply 92. To this end, the control unit 94 supplies one of the pulse signals output from the pulse generation unit 94b to the first high frequency power supply 92 via a line L5 as a control signal C1. The control signal C1 may be a first control signal according to the exemplary embodiment. The first high frequency power supply 92 is configured to output the first high frequency power and stop the output of the first high frequency power according to a level of the control signal C1. For example, when the control signal C1 is at the H-level, the first high frequency power supply 92 outputs the first high frequency power, and when the control signal C1 is at the L-level, the first high frequency power supply 92 stops the output of the first high frequency power. As a result, a state in which plasma exists and a state in which the plasma is extinguished are created within the processing vessel 10 alternately.

Further, the control unit 94 is configured to control on/off operation of the second high frequency power supply 93. To elaborate, the control unit 94 controls on/off operation of the second high frequency power supply 93 such that the second high frequency power is output from the second high frequency power supply 93 for a time period during which the first high frequency power supply 92 is outputting the first high frequency power and such that the output of the second high frequency power from the second high frequency power supply 93 is stopped for a time period during which the output of the first high frequency power from the first high frequency power supply 92 is stopped. For this purpose, the control unit 94 supplies one of the pulse signals output from the pulse generation unit 94b to the second high frequency power supply 93 via a line L6 as a control signal C2. The second high frequency power supply 93 outputs the second high frequency power and stops the output of the second high frequency power according to a level of the control signal C2. For example, when the control signal C2 is at the H-level, the second high frequency power supply 93 outputs the second high frequency power, and when the control signal C2 is at the L-level, the second high frequency power supply 93 stops the output of the second high frequency power.

Further, the control signal C1 sent to the first high frequency power supply 92 and the control signal C2 sent to the second high frequency power supply 93 may be synchronized. That is, a phase of the control signal C1 and a phase of the control signal C2 may coincide with each other. Furthermore, a single pulse signal may be used as the control signal C1 and the control signal C2. On the contrary, it may be also possible that a phase difference may be set between the control signal C1 and the control signal C2. That is, a preset phase difference may be set between the control signal C1 and the control signal C2 such that the second high frequency power is output from the second high frequency power supply 93 for a part of the time period during which the first high frequency power supply 92 is outputting the first high frequency power and such that the output of the second high frequency power from the second high frequency power supply 93 is stopped for a part of the time period during which the output of the first high frequency power from the first high frequency power supply 92 is stopped.

Furthermore, the control unit 94 is also configured to control the first matching device 97 such that a matching operation of the first matching device 97 is synchronized with the on/off operation of the first high frequency power supply 92. For this purpose, the control unit 94 sends one of the pulse signals output from the pulse generation unit 94b to the first matching device 97 as a control signal C3 via a line L7. Further, the control unit 94 is also configured to control the second matching device 98 such that a matching operation of the second matching device 98 is synchronized with the on/off operation of the second high frequency power supply 93. For this purpose, the control unit 94 sends one of the pulse signals output from the pulse generation unit 94b to the second matching device 98 as a control signal C4 via a line L8.

When the first matching device 97 is not capable of keeping up with the on/off operation of the first high frequency power supply 92, the control unit 94 may control the first matching device 97 not to be operated. That is, the control unit 94 may control the first matching device 97 such that the first matching device 97 maintains a matched state with the first high frequency power supply 92 being in an on-state even when the first high frequency power supply 92 is off. Further, in case that the second matching device 98 is not capable of keeping up with the on/off operation of the second high frequency power supply 93, the control unit 94 may control the second matching device 98 not to be operated. That is, the control unit 94 may control the second matching device 98 such that the second matching device 98 maintains a matched state with the second high frequency power supply 93 being in an on-state even when the second high frequency power supply 93 is off. If, however, the operations of the first matching device 97 and the second matching device 98 are sufficiently rapid, the first matching device 97 may be controlled such that the internal impedance of the first high frequency power supply 92 and the load impedance containing the plasma within the processing vessel 10 are matched. Likewise, the second matching device 98 may be controlled such that the internal impedance of the second high frequency power supply 93 and the load impedance containing the plasma within the processing vessel 10 are matched.

Figure 3:
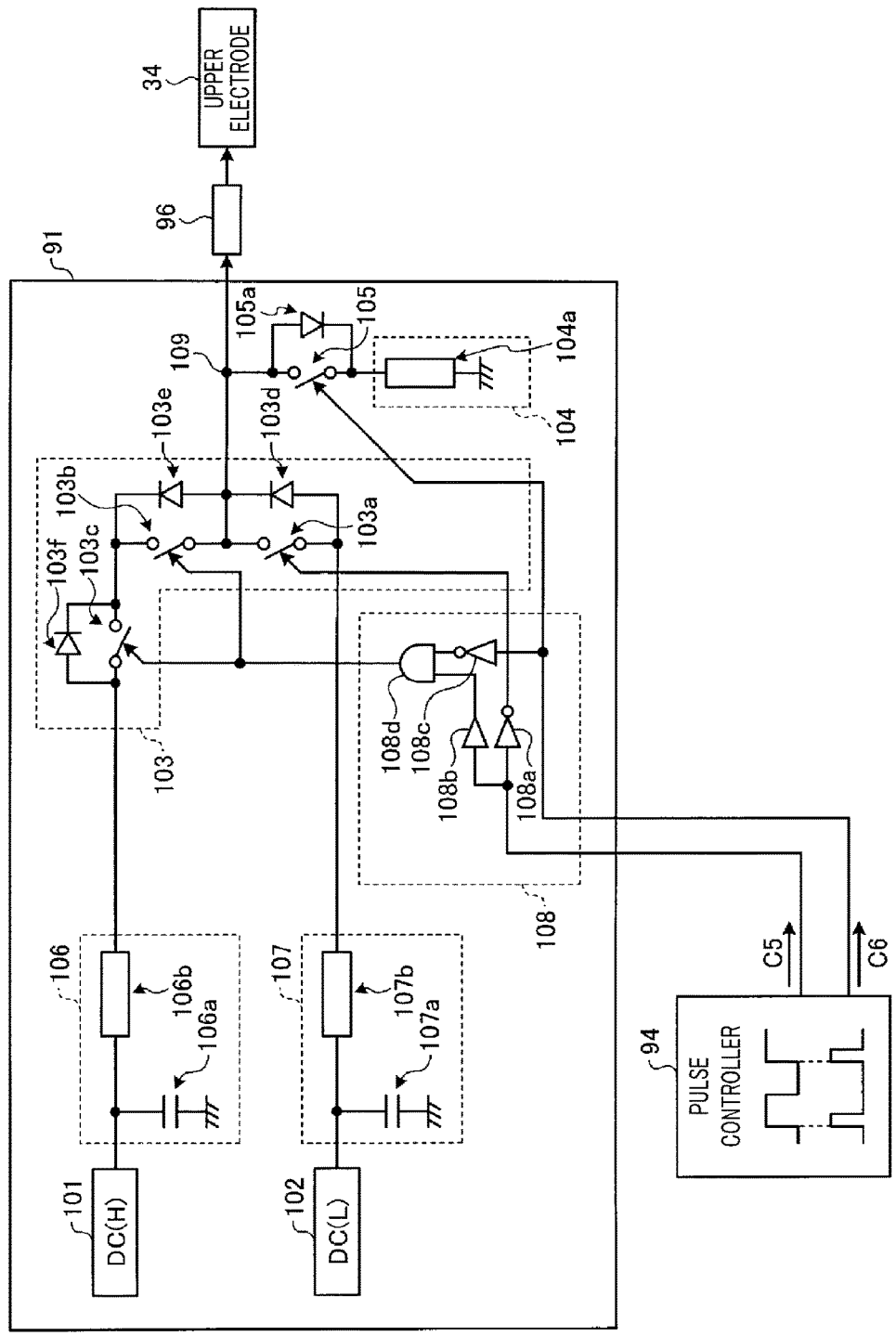
FIG. 3 is a circuit diagram illustrating a configuration of a DC power supply according to the exemplary embodiment.

As depicted in FIG. 2, the DC power supply 91 is configured to apply an output voltage, which is a negative DC voltage, to the upper electrode 34. The DC power supply 91 is connected to the control unit 94 via lines L9a and L9b, and also connected to the LPF 96 via a line L10. Further, the LPF 96 is connected to the upper electrode 34 via a line L11. Hereinafter, referring to FIG. 2 and FIG. 3, the DC power supply 91 will be further elaborated. FIG. 3 is a circuit diagram illustrating a configuration of the DC power supply according to the exemplary embodiment. The DC power supply 91 shown in FIG. 3 includes a first DC power supply unit 101, a second DC power supply unit 102, a selecting circuit 103 and a discharging circuit 104.

The first DC power supply unit 101 is electrically connected to the selecting circuit 103, and is configured to supply a first DC voltage which is a negative DC voltage. The first DC voltage is set within a range from, by way of example, but not limitation, 0 V to −800 V. In the exemplary embodiment, a circuit unit 106 for stabilizing a value of the first DC voltage is provided between the first DC power supply unit 101 and the selecting circuit 103. The circuit unit 106 includes a capacitor 106a and a resistor element 106b. One end of the resistor element 106b is connected to the first DC power supply unit 101, and the other end of the resistor element 106b is connected to the selecting circuit 103. Further, one end of the capacitor 106a is connected to a ground potential, and the other end of the capacitor 106a is connected to a connection point between the first DC power supply unit 101 and the resistor element 106b. The capacitor 106a has a capacity of, for example, 1 μF, and the resistor element 106b has a resistance of, for example, 50Ω.

The second DC power supply unit 102 is electrically connected to the selecting circuit 103, and is configured to supply a second DC voltage. The second DC voltage is a negative DC voltage, and an absolute value thereof is larger than an absolute value of the first DC voltage. It is desirable that the absolute value of the second DC voltage becomes larger. There is no upper limit in the absolute value of the second DC voltage. In consideration of tolerance of the plasma etching apparatus 1, however, the absolute value of the second DC voltage may be set to be smaller than 2000 V. Further, provided between the second DC power supply unit 102 and the selecting circuit 103 is a circuit unit 107 for stabilizing a value of the second DC voltage. The circuit unit 107 includes a capacitor 107a and a resistor element 107b. One end of the resistor element 107b is connected to the second DC voltage unit 102, and the other end of the resistor element 107b is connected to the selecting circuit 103. Further, one end of the capacitor 107a is connected to a ground potential, and the other end of the capacitor 107a is coupled to a connection point between the second DC power supply unit 102 and the resistor element 107b. The capacitor 107a has a capacity of, for example, 1 μF, and the resistor element 107b has a resistance of, for example, 50Ω.

The selecting circuit 103 is configured to selectively connect the first DC power supply unit 101 and the second DC power supply unit 102 to the upper electrode 34. In the exemplary embodiment, the selecting circuit 103 includes a switching device 103a, a switching device 103b and a switching device 103c. Each of the switching devices 103a to 103c has a first terminal, second terminal and a control terminal. The first terminal of the switching device 103c is electrically connected to the first DC power supply unit 101. The first terminal of the switching device 103b is electrically connected to the second terminal of the switching device 103c. The first terminal of the switching device 103a is electrically connected to the second DC power supply unit 102. The second terminal of the switching device 103a and the second terminal of the switching device 103b are electrically connected to each other, and a connection point between these output terminals is connected to the upper electrode 34 via the LPF 96. Further, the LPF 96 is configured to block high frequency powers from the first high frequency power supply 92 and the second high frequency power supply 93, as will be described later, and may be implemented by, but not limited to, an LR filter or an LC filter. Further, a rectifying device 103d, a rectifying device 103e and a rectifying device 103f are connected in parallel to the switching device 103a, the switching device 103b and the switching device 103c, respectively.

The control terminals of the switching devices 103a to 103c are connected to the pulse generation unit 94b of the control unit 94 via a circuit unit 108. The circuit unit 108 includes a reversing circuit 108a, a non-reversing circuit 108b, a reversing circuit 108c and an AND gate 108d. The reversing circuit 108a is connected to the switching device 103a. The non-reversing circuit 108b is connected to either one of two input terminals of the AND gate 108d. The reversing circuit 108c is connected to the other of the two input terminals of the AND gate 108d. The AND gate 108d is configured to output a control signal having an amplitude level of H-level to the switching devices 103b and 103c only when the level of the control signal input from the non-reversing circuit 108b is the H-level and the level of the control signal input from the reversing circuit 108c is the H-level. One of the pulse signals output from the pulse generation unit 94b of the control unit 94 is sent to the DC power supply 91 as a control signal C5, and another one of the pulse signals output from the pulse generation unit 94b of the control unit 94 is sent to the DC power supply 91 as a control signal C6. A frequency of the control signal C6 is the same as a frequency of the control signal C5, and a duty ratio of the control signal C6 is smaller than a duty ratio of the control signal C5. Further, the frequency of the control signal C5 and the frequency of the control signal C6 are the same as a frequency of the control signal C1 sent to the first high frequency power supply 92 and a frequency of the control signal C2 sent to the second high frequency power supply 93.

Of the two control signals C5 and C6, the control signal C6 controls the switching devices 103b and 103c and a switching circuit 105 to be described later such that connections of the upper electrode 34 to the first DC power supply unit 101 and the second DC power supply unit 102 are disconnected and the discharging circuit 104 is connected to a connection point 109 between the selecting circuit 103 and the upper electrode 34 during a preset time period from the beginning of the supply of the first high frequency power while the first high frequency power is being supplied from the first high frequency power supply 92. In the following description, the preset time period from the beginning of the supply of the first high frequency power will be referred to as "voltage stop period." The voltage stop period is an example of a first period. The voltage stop period is increased or decreased according to the duty ratio of the control signal C6. That is, the voltage stop period is increased or decreased according to a variation of the pulse width of the control signal C6. The control signal C5 controls the switching devices 103a, 103b and 103c in cooperation with the control signal C6 such that the first DC power supply unit 101 is connected to the upper electrode 34 for a time period except the voltage stop period within the time period during which the first high frequency power is being supplied from the first high frequency power supply 92 and, also, such that the second DC power supply unit 102 is connected to the upper electrode 34 for a time period during which the supply of the first high frequency power from the first high frequency power supply 92 is stopped. The time period except the voltage stop period is an example of a second period. For example, when the control signal C6 has the H-level, the switching circuit 105 is closed so that the discharging circuit 104 is connected to the connection point 109, and, also, the switching devices 103a to 103c are opened regardless of which one of the H-level and the L-level the control signal C5 has. Further, for example, when the control signal C6 has the L-level and the control signal C5 has the H-level, the switching devices 103b and 103c are closed, so that the first DC power supply unit 101 is connected to the upper electrode 34. Furthermore, for example, when the control signal C6 has the L-level and the control signal C5 has the L-level, the switching device 103a is closed, so that the second DC power supply unit 102 is connected to the upper electrode 34. If these control signals C5 and C6 are sent to the DC power supply 91, a reverse pulse signal of the control signal C5 from the reversing circuit 108a is sent to the control terminal of the switching device 103a. Further, a non-reverse pulse signal of the control signal C5 from the non-reversing circuit 108b is sent to the control terminals of the switching devices 103b and 103c via the AND gate 108d. Furthermore, a reverse pulse signal of the control signal C6 from the reversing circuit 108c is sent to the control terminals of the switching devices 103b and 103c via the AND gate 108d. Further, the control signal C6 itself is sent to the switching circuit 105.

The discharging circuit 104 is connected to the connection point 109 between the selecting circuit 103 and the upper electrode 34 via the switching circuit 105. When the first DC power supply unit 101 and the second DC power supply unit 102 are disconnected from the upper electrode 34, the discharging circuit 104 discharges an electric field of the upper electrode 34 to the grounding potential to set a voltage of the upper electrode 34 to zero (0). In the exemplary embodiment, the discharging circuit 104 includes a resistor element 104a. One end of the resistor element 104a is connected to a ground potential, and the other end thereof is coupled to the connection point 109. The resistor element 104a may have a resistance of 50Ω. The switching circuit 105 is provided between the discharging circuit 104 and the connection point 109, and a rectifying device 105a is connected in parallel to the switching circuit 105. The switching circuit 105 can be connected to the upper electrode 34 selectively via the connection point 109. To elaborate, in case that the first DC power supply unit 101 or the second DC power supply unit 102 is connected to the upper electrode 34, the switching circuit 105 disconnects the connection between the discharging circuit 104 and the connection point 109. Meanwhile, in case that the first DC power supply unit 101 and the second DC power supply unit 102 are disconnected from the upper electrode 34, the switching circuit 105 connects the discharging circuit 104 and the connection point 109. The control of this switching circuit 105 can be performed by the control signal C6 from the control unit 94.

Referring back to FIG. 2, the Vpp measuring unit 99 is connected to the second matching device 98, and is configured to measure a Vpp (Volt peak to peak) value which is an amplitude value of a voltage corresponding to the second high frequency power for ion attraction. The Vpp measuring unit 99 outputs the measured Vpp value to the control unit 94.

The E/R acquiring unit 110 is configured to acquire an etching rate of the semiconductor wafer W as a processing target object. For example, the E/R acquiring unit 110 acquires an etching rate of the semiconductor wafer W input through the user interface 100a by the user of the plasma etching apparatus 1. The E/R acquiring unit 110 outputs the acquired etching rate to the control unit 94.

Figure 4:
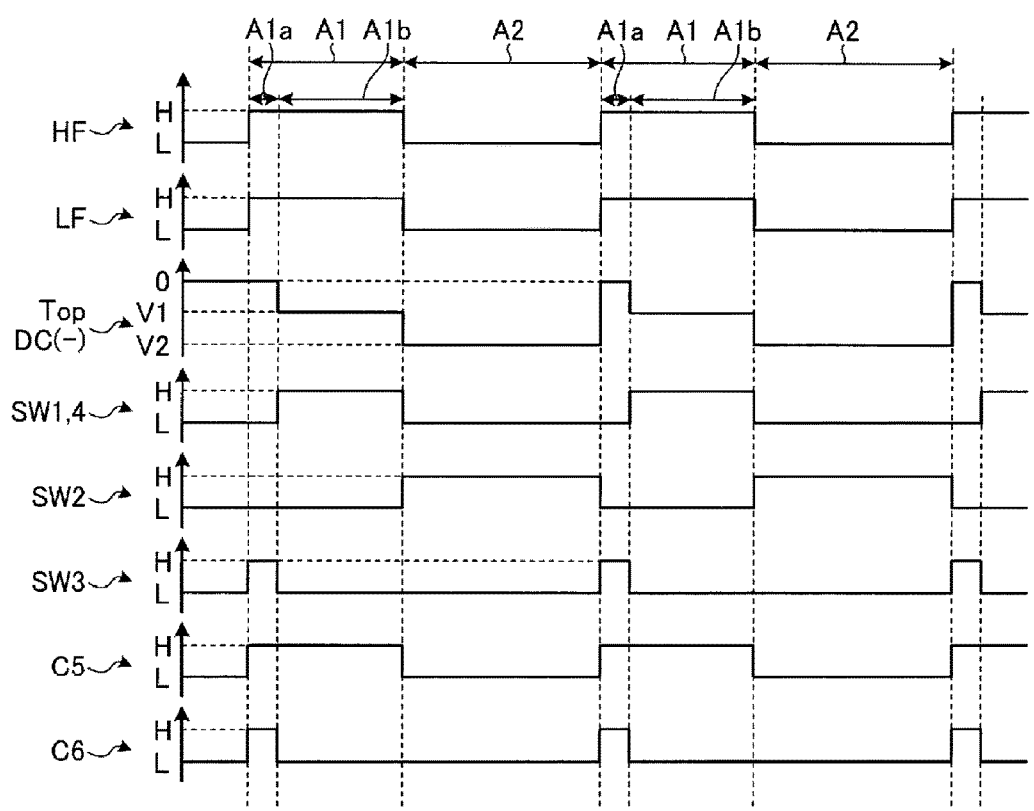
FIG. 4 is an example time chart of a power supply control process according to the exemplary embodiment.

Now, a power supply control process performed by the control unit 94 shown in FIG. 2 will be explained. FIG. 4 is a diagram showing an example time chart of the power supply control process according to the exemplary embodiment.

In FIG. 4, "HF" is a time chart indicating a waveform of the control signal C1 supplied to the first high frequency power supply 92, and "LF" is a time chart indicating a waveform of the control signal C2 supplied to the second high frequency power supply 93. "Top DC(-)" is a time chart indicating a waveform of the DC voltage supplied to the upper electrode 34 from the DC power supply 91. "SW1, 4" is a time chart indicating a waveform of a control signal for controlling opening/closing of the switching device 103b and the switching device 103c. "SW2" is a time chart indicating a waveform of a control signal for controlling opening/closing of the switching device 103a. "SW3" is a time chart indicating a waveform of a control signal for controlling opening/closing of the switching circuit 105. "C5" is a time chart indicating a waveform of the control signal C5 supplied to the DC power supply 91. "C6" is a time chart indicating a waveform of the control signal C6 supplied to the DC power supply 91.

As depicted in FIG. 4, the control unit 94 repeats a supply and a stop of the supply of the high frequency power to the lower electrode 16 alternately.

To be specific, during a period A1, the control unit 94 supplies the first high frequency power for plasma generation to the lower electrode 16 from the first high frequency power supply 92 by using the control signal C1 having the H-level, and also supplies the second high frequency power for ion attraction to the lower electrode 16 from the second high frequency power supply 93 by using the control signal C2 having the H-level. Accordingly, plasma of a processing gas supplied into the processing space E between the upper electrode 34 and the lower electrode 16 is generated, and a plasma sheath is begun to be grown on a semiconductor wafer W. Meanwhile, during a period A2, the control unit 94 stops the supply of the first high frequency power for plasma generation from the first high frequency power supply 92 by using the control signal C1 having the L-level, and also stops the supply of the second high frequency power for ion attraction from the second high frequency power supply 93 by using the control signal C2 having the L-level. As a result, the plasma is extinguished, and the plasma sheath on the semiconductor wafer W is reduced or extinguished.

Further, the control unit 94 stops the supply of the first DC voltage V1 and the second DC voltage V2 to the upper electrode 34 during a voltage stop period A1a, which is a preset time period from the beginning of the supply of the high frequency power while the high frequency power is being supplied. Here, the voltage stop period A1a is a preset time period taken before the growth of the plasma sheath on the semiconductor wafer W is completed after the plasma sheath is begun to be grown.

To elaborate, during the voltage stop period A1a, the control unit 94 controls the selecting circuit 103 (the switching devices 103a, 103b and 103c) by using the control signal C6 having the H-level such that the first DC power supply unit 101 and the second DC power supply unit 102 are disconnected from the upper electrode 34, and also controls the switching circuit 105 such that the discharging circuit 104 is connected to the connection point 109. Accordingly, in the state that the plasma sheath generated on the semiconductor wafer W is not fully grown, the voltage to the upper electrode 34 is set to be zero (0).

Further, the control unit 94 supplies the first DC voltage V1 to the upper electrode 34 during a period A1b except the voltage stop period A1a within the period A1 while the high frequency power is being supplied.

To elaborate, the control unit 94 controls the selecting circuit 103 (the switching devices 103a, 103b and 103c) by using the control signal C6 having the L-level and the control signal C5 having the H-level such that the first DC power supply unit 101 is connected to the upper electrode 34 during the period A1b. Accordingly, in the state that the growth of the plasma sheath generated on the semiconductor wafer W is completed, the first DC voltage V1 is supplied to the upper electrode 34, and electrons emitted as a result of collision of positive ions with the upper electrode 34 are accelerated toward the semiconductor wafer W.

Further, the control unit 94 supplies the second DC voltage V2 to the upper electrode 34 for the period A2 during which the supply of the high frequency powers is stopped.

To elaborate, the control unit 94 controls the selecting circuit 103 (the switching devices 103a, 103b and 103c) by using the control signal C6 having the L-level and the control signal C5 having the L-level such that the second DC power supply unit 102 is connected to the upper electrode 34 during the period A2. Accordingly, in the state that the plasma sheath on the semiconductor wafer W is reduced or extinguished, the electrons emitted as a result of collision of the positive ions with the upper electrode 34 are accelerated toward the semiconductor wafer W on the lower electrode 16.

As stated above, the plasma etching apparatus 1 according to the exemplary embodiment performs the power supply control process in which the supply of the high frequency powers and the stop of the supply of these high frequency powers are repeated alternately; the supply of the first DC voltage V1 and the supply of the second DC voltage V2 are stopped during the voltage stop period A1a, which is the preset time period from the beginning of the supply of the high frequency powers within the period A1 during which the high frequency powers are being supplied; the first DC voltage V1 is supplied during the period A1b except the voltage stop period A1a within the period A1; and the second DC voltage V2 is supplied during the period A2 during which the supply of the high frequency powers is stopped. Accordingly, it is possible to suppress electrons from being bounced off the plasma sheath generated on the semiconductor wafer W, which is accompanied by supplying the high frequency powers to the lower electrode 16. As a result, according to the plasma etching apparatus 1 of the present exemplary embodiment, it is possible to suppress the electric discharge from occurring at the upper electrode 34 side.

Furthermore, from a relationship of the respective time charts shown in FIG. 4, a duty ratio of the control signal C5 is defined by (voltage stop period A1a+period A1b)/(period A1 during which the high frequency power is being supplied+period A2 during which the supply of the high frequency power is stopped). Further, a duty ratio of the control signal C6 is defined by (voltage stop period A1a)/(period A1 during which the high frequency power is being supplied +period A2 during which the supply of the high frequency power is stopped). That is, the duty ratio of the control signal C6 is smaller than the duty ratio of the control signal C5.

Figure 5:
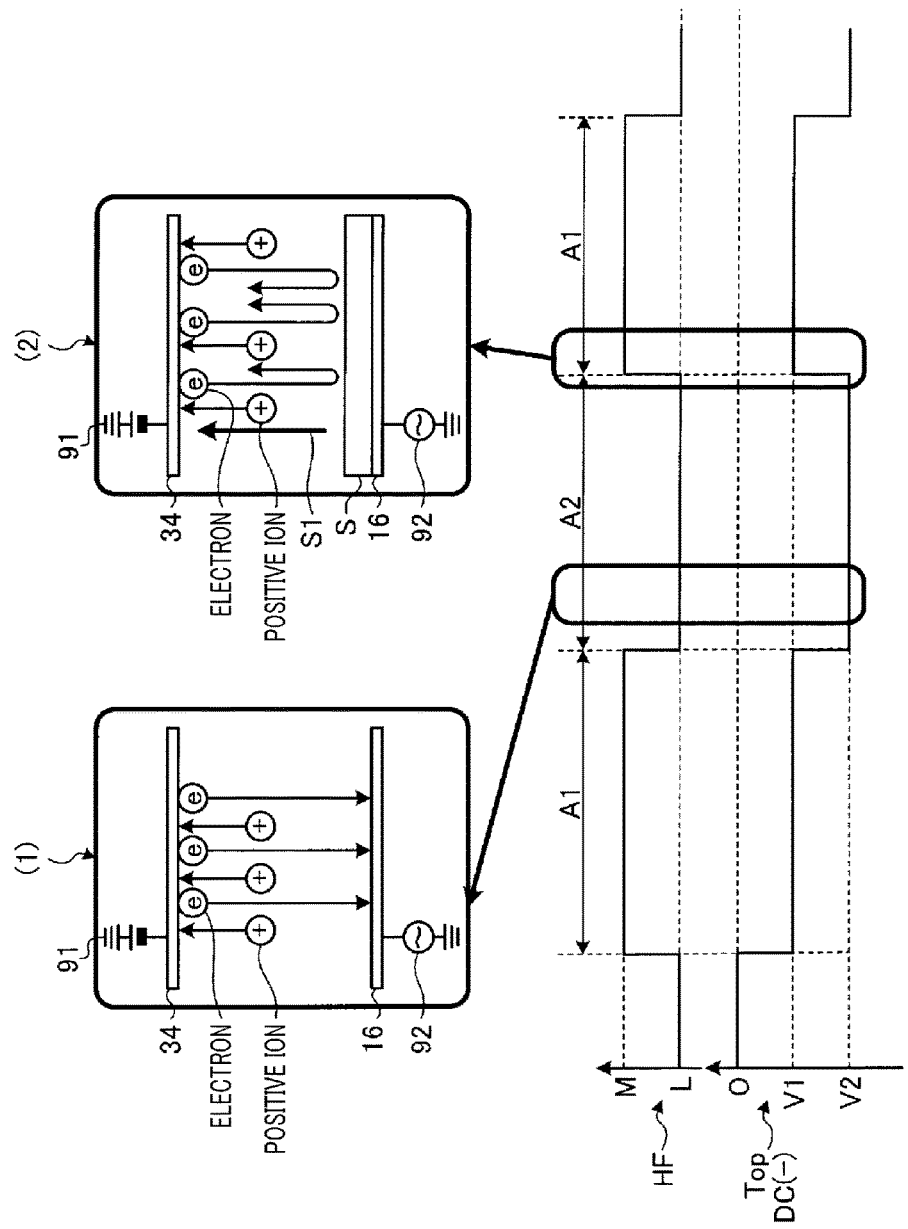
FIG. 5 is a diagram for describing a conventional power supply control process.

Here, a mechanism of suppressing the electric discharge by the power supply control process according to the exemplary embodiment will be described in detail. Before describing the mechanism of suppressing the electric discharge by the power supply control process according to the exemplary embodiment, however, a conventional power supply control process will be explained first for reference. FIG. 5 is a diagram for describing the conventional power supply control process. In FIG. 5, "e" denotes an electron, and "+" indicates a positive ion.

The control unit 94 supplies the second DC voltage V2 to the upper electrode 34 for the period A2 during which the supply of the high frequency power to the lower electrode 16 is stopped. Accordingly, as depicted in (1) of FIG. 5, electrons emitted as a result of collision of positive ions with the upper electrode 34 are accelerated toward the semiconductor wafer W on the lower electrode 16 in the state that a plasma sheath on the semiconductor wafer W is reduced or extinguished. Here, for the period A2, since the second DC voltage V2 having a larger absolute value than that of the first DC voltage V1 is supplied to the upper electrode 34, a larger amount of electrons are supplied to the semiconductor wafer W, as compared to the period A1. Consequently, the positive ions collected in the bottom portion of the hole of the semiconductor wafer W are neutralized efficiently. Further, in (1) of FIG. 5, a length of an arrow of the positive ion indicates that the positive ion reaches the upper electrode 34, and a length of an arrow of the electron indicates that the electron reaches the semiconductor wafer W on the lower electrode 16.

If the supply of the high frequency power to the lower electrode 16 is resumed, the control unit 94 supplies the first DC voltage V1 to the upper electrode 34 concurrently with the supply of the high frequency power. Accordingly, as depicted in (2) of FIG. 5, for the period A1 during which the high frequency power is being supplied to the lower electrode 16, collision of the positive ions with the upper electrode 34 is accelerated in the state that the plasma sheath S, which is generated on the semiconductor wafer W and accompanied by supplying the high frequency power to the lower electrode 16, is not fully grown. At this time, the electrons emitted as a result of the collision of the positive ions with the upper electrode 34 are accelerated toward the semiconductor wafer W. Then, the accelerated electrons are bounced off in a direction S1 approaching the upper electrode 34 by the plasma sheath S which is growing in a direction away from the semiconductor wafer W, i.e., in the direction 51 approaching the upper electrode 34. The electrons bounced in the direction 51 approaching the upper electrode 34 by the plasma sheath S which is growing in the direction 51 approaching the upper electrode 34 are accelerated by receiving relatively large kinetic energy. As a result, in the conventional power supply control process, the electric discharge may occur at the upper electrode 34 side due to the bounced electrons having the high energy. In (2) of FIG. 5, the length of the arrow of the positive ion indicates that the positive ion is reaching the upper electrode 34, and the length of the arrow of the electron indicates that the electron is bounced off the surface of the plasma sheath S.

Figure 6:
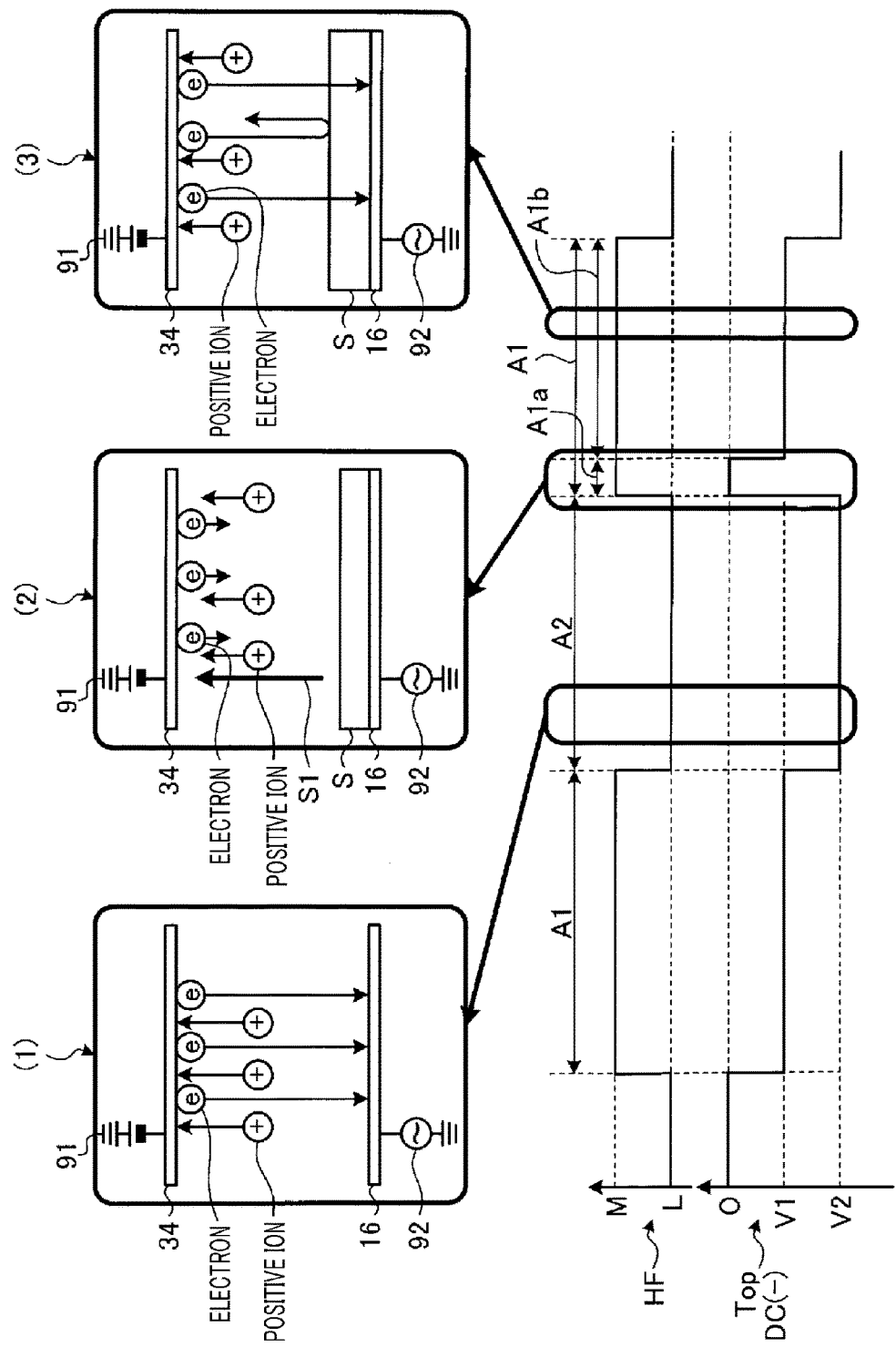
FIG. 6 is a diagram for describing a mechanism of suppressing an electric discharge by performing a power supply control process according to the exemplary embodiment.

Meanwhile, a mechanism of suppressing the electric discharge by the power supply control process according to the exemplary embodiment will now be described. FIG. 6 is a diagram for describing the mechanism of suppressing the electric discharge by the power supply control process according to the exemplary embodiment. In FIG. 6, "e" denotes an electron, and "+" denote a positive ion. Further, in (1) to (3) of FIG. 6, the length of the arrow of the electron and the length of the arrow of the positive ion indicates the amount of kinetic energy applied to the electron or the positive ion when they are accelerated.

For the period A2 during which the supply of the high frequency power to the lower electrode 16 is stopped, the control unit 94 supplies the second DC voltage V2 to the upper electrode 34. Accordingly, as shown in (1) of FIG. 6, the electrons emitted as a result of the collision of the positive ions with the upper electrode 34 are accelerated toward the semiconductor wafer W on the lower electrode 16 in the state that the plasma sheath on the semiconductor wafer W is reduced or extinguished. Here, for the period A2, since the second negative DC voltage V2 having the absolute value larger than that of the first DC voltage V1 is supplied to the upper electrode 34, a larger amount of electrons are supplied to the semiconductor wafer W, as compared to that for the period A1. As a result, the positive ions collected in the bottom portion of the hole of the semiconductor wafer W can be efficiently neutralized.

If the supply of the high frequency power to the lower electrode 16 is resumed, the control unit 94 stops the supplies of the first DC voltage V1 and the second DC voltage V2 to the upper electrode 34 during the voltage stop period A1a which is the preset time period from the beginning of the supply of the high frequency power. Accordingly, as shown in (2) of FIG. 6, since a voltage of the upper electrode 34 is set to be zero (0) in the state that the plasma sheath S generated on the semiconductor wafer W is not completely grown, the collision of positive ions with the upper electrode 34 is suppressed. Accordingly, emission of the electrons from the upper electrode 34 is also suppressed during the voltage stop period A1a. Thus, during the voltage stop period A1a, it is possible to avoid the above-stated problem that the electrons are bounced off by the plasma sheath S which is growing on the semiconductor wafer W in the direction S1 approaching the upper electrode 34. As a result, it is possible to suppress the electric discharge at the upper electrode 34 side during the voltage stop period A1a.

The control unit 94 supplies the first DC voltage V1 to the upper electrode 34 during the period A1b except the voltage stop period A1a within the period A1 during which the high frequency power is being supplied. Accordingly, as shown in (3) of FIG. 6, the electrons emitted as a result of collision of the positive ions with the upper electrode 34 are accelerated toward the semiconductor wafer W. A part of the accelerated electrons is bounced off in the direction S1 approaching the upper electrode 34 by the plasma sheath S which is completely grown in the direction S1 approaching the upper electrode 34. Here, within the period A1b, the growth of the plasma sheath S generated on the semiconductor wafer W is already completed. Accordingly, in the period A1b, the electrons bounced in the direction S1 approaching the upper electrode 34 are not accelerated. As a result, it is possible to suppress the electric discharge at the upper electrode 34 side during the period A1b.

Now, the first calibration process performed by the control unit 94 shown in FIG. 2 will be explained. The voltage stop period A1a in the power supply control process is a time period taken before the growth of the plasma sheath on the semiconductor wafer W is completed after the growth thereof is started, as stated above. A speed of the growth of the plasma sheath on the semiconductor wafer W varies depending on the Vpp value which is an amplitude value of a voltage corresponding to the second high frequency power for ion attraction. Meanwhile, since the Vpp value sharply increases when an abnormal electric discharge occurs, by checking a degree of the variation of the Vpp value, it is possible to select an appropriate time length of the voltage stop period A1$a$ during which the abnormal electric discharge does not occur. In this regard, in the plasma etching apparatus 1 according to the exemplary embodiment, the first calibration process, in which the voltage stop period A1$a$ is corrected to an appropriate time period during which the abnormal electric discharge does not occur, is performed by using the Vpp value.

First, the control unit 94 performs the power supply control process while changing the voltage stop period A1$a$ to a plurality of candidate periods, which are candidates of the voltage stop period A1$a$. The control unit 94 receives a Vpp value which is input from the Vpp measuring unit 99. For each candidate period, the control unit 94 calculates a Vpp variation ratio indicating the degree of the variation of the Vpp value. The Vpp variation ratio is a parameter which increases depending on a frequency of the occurrence of the abnormal electric discharge. The Vpp variation ratio is calculated by using the following equation (1), for example. By calculating the Vpp variation ratio with respect to corresponding candidate period, data indicating a relationship between the Vpp variation ratios and the candidate periods are created.

$$\text{Vpp variation ratio}=100\times(\text{Vpp\_max}-\text{Vpp\_ave})/\text{Vpp\_ave} \quad (1)$$

Here, Vpp_max denotes a maximum of the Vpp value in a preset time T, and Vpp_ave indicates an average of the Vpp value in the preset time T.

Subsequently, based on the data indicating the relationship between the Vpp variation ratios and the candidate periods, the control unit 94 selects a candidate period which allows the Vpp variation ratio to be equal to or less than a preset tolerance value, and corrects the voltage stop period A1$a$ to the selected candidate period. When there is a plurality of candidate periods that allow the Vpp variation ratio to be equal to or less than the preset tolerance value, the control unit 94 corrects the voltage stop period A1$a$ to a candidate period that allows the lowest Vpp variation ratio.

As described above, in the plasma etching apparatus 1 according to the exemplary embodiment, the first calibration process, in which the voltage stop period A1$a$ is corrected to the candidate period which allows the Vpp variation ratio indicating the variation degree of the Vpp value to be equal to or less than the preset tolerance value, is performed. Accordingly, it is possible to correct the voltage stop period A1$a$ to an appropriate time period when the growth of the plasma sheath on the semiconductor wafer W is completed. Therefore, in the voltage stop period A1$a$, it is possible to certainly avoid bouncing of electrons by plasma sheath which is growing on the semiconductor wafer W in the direction approaching the upper electrode 34. As a result, the electric discharge in the upper electrode 34 can be securely suppressed during the voltage stop period A1$a$.

Figure 7:
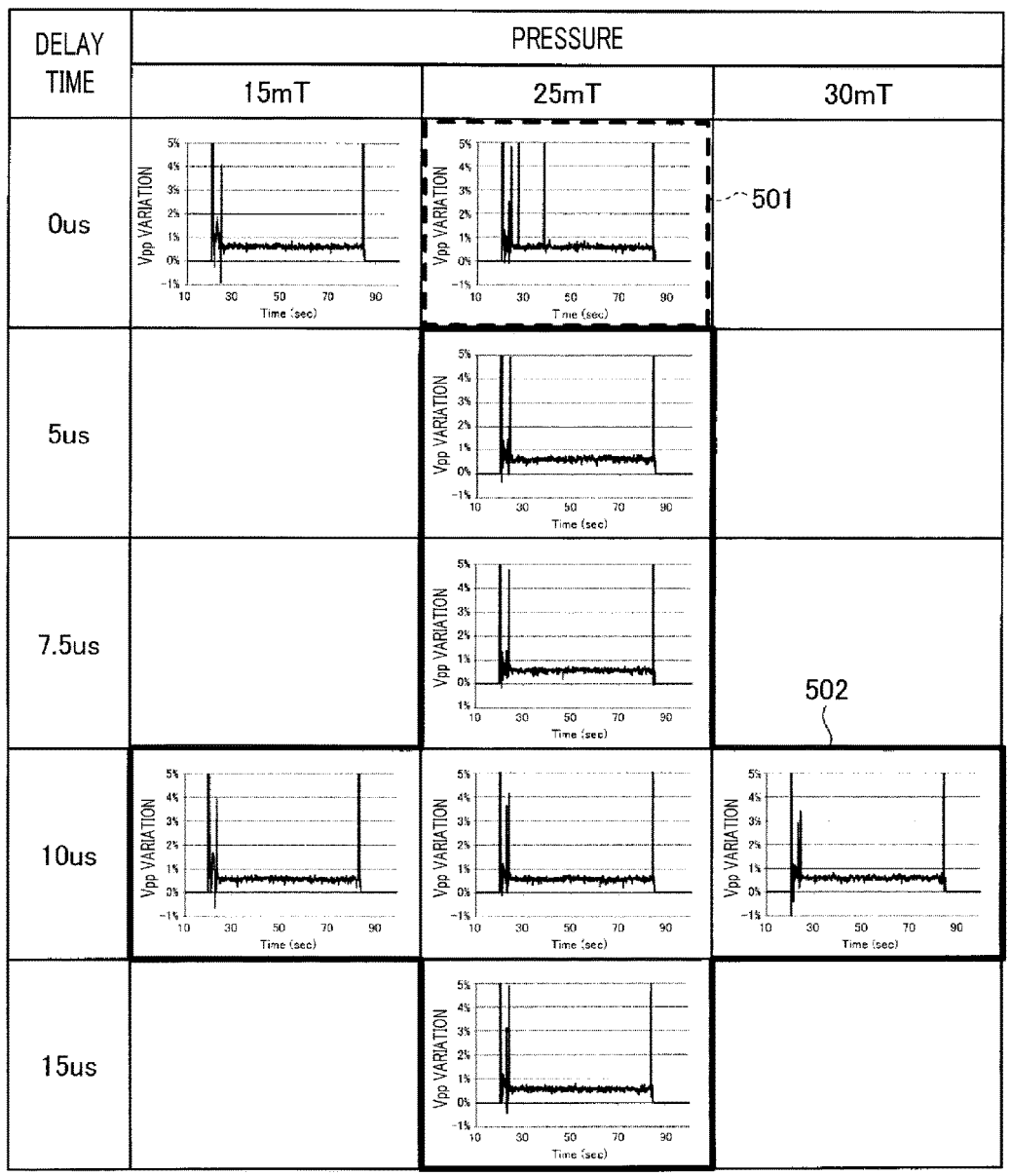
FIG. 7 is diagram showing an example of experimental results showing a relationship between a plurality of candidate periods as candidates of a voltage stop period A1*a* and a Vpp variation ratio corresponding to each of the candidate periods.

FIG. 7 is a diagram illustrating an example of experimental results showing a relation between a plurality of candidate periods as candidates of the voltage stop period A1$a$ and Vpp variation ratios corresponding to the candidate periods. On each graph shown in FIG. 7, a horizontal axis represents a time (sec), and a vertical axis indicates a Vpp variation ratio (%). Further, in FIG. 7, "Delay time" indicates candidate periods (µsec) as candidates of the voltage stop period A1$a$, and "Pressure" indicates a pressure (mTorr) within the processing vessel 10.

Further, in FIG. 7, as other processing conditions, a processing gas of $C_4F_6/C_4F_8/O_2/Ar/C_4F_6$=85 sccm/88 sccm/170 sccm/400 sccm/5 sccm is used; the first high frequency power from the first high frequency power supply 92 is set to 2000 W; the second high frequency power from the second high frequency power supply 93 is set to 14 kW; frequencies of the first and second high frequency powers are set to be 5 kHz; duty ratios of the first and second high frequency powers are 20%; DC voltages applied to the upper electrode 34 is set to be (first DC voltage V1)/(second DC voltage V2)=−500 V/−1000 V; and a processing time is set to be 60 sec. Further, in the following description, the Vpp variation ratio indicates a Vpp variation ratio except a Vpp variation ratio corresponding to an on/off switching time of the first high frequency power supply 92 and the second high frequency power supply 93.

As clearly seen from the experimental result of FIG. 7, when the candidate period is zero (0) (that is, when the voltage stop period A1$a$ is not set), the Vpp variation ratio has a maximum value, and as the candidate period increases from zero (0), the Vpp variation ratio decreases. Based on this experimental results, the inventors have further investigated and found out that, if the candidate period is less than 5 µsec, the Vpp variation ratio exceeds about 2.0% as indicated by a dashed-line frame 501 of FIG. 7; if the candidate period is equal to or longer than 5 µsec, the Vpp variation ratio is suppressed equal to or below about 2.0%, as indicated by a solid-line frame 502 of FIG. 7. Further, the inventors also found out that if the Vpp variation ratio is equal to or less than 2.0%, the electric discharge in the upper electrode 34 is suppressed. In view of this experimental results, it is desirable to set the voltage stop period A1$a$ to be equal to or longer than 5 µsec, which corresponds to the solid-line frame 502 of FIG. 7. Therefore, in the exemplary embodiment, the control unit 94 selects a candidate period (for example, a period equal to or longer than 5 µsec) which allows the Vpp variation ratio to be equal to or less than the preset tolerance value (e.g., 2.0%), and corrects the voltage stop period A1$a$ to the selected candidate period. As a result, it is possible to suppress the electric discharge in the upper electrode 34 securely during the voltage stop period A1$a$.

Now, the second calibration process performed by the control unit 94 shown in FIG. 2 will be explained. It is desirable that the voltage stop period A1$a$ in the power supply control process is equal to or longer than 5 µsec in view of suppressing the electric discharge in the upper electrode 34, without having any specific upper limit. If, however, the voltage stop period A1$a$ increases excessively, the amount of the electrons accelerated toward the semiconductor wafer W after emitted from the upper electrode 34 decreases. If the amount of the electrons accelerated toward the semiconductor wafer W is reduced, plasma density decreases, and the degree of reduction of the etching rate of the semiconductor wafer W would be increased. Accordingly, in the plasma etching apparatus 1 according to the exemplary embodiment, the second calibration process, in which the voltage stop period A1$a$ is corrected by using the etching rate of the semiconductor wafer W from the viewpoint of setting the upper limit of the voltage stop period A1$a$, is performed.

First, the control unit 94 performs the power supply control process while changing the voltage stop period A1$a$ to a plurality of candidate periods, which are candidates of the voltage stop period A1$a$. The control unit 94 receives an etching rate which is input from the E/R acquiring unit 110. For each candidate period, the control unit 94 calculates an etching rate reduction ratio indicating the degree of the variation of the etching rate. The etching rate reduction ratio is calculated by using the following equation (2), for example. By calculating the etching rate reduction ratio with respect to corresponding candidate period, data indicating a relationship between the etching rate reduction ratios and the candidate periods are created.

$$\text{Etching rate reduction ratio} = 100 \times (ER0 - ER)/ER0 \qquad (2)$$

Here, ER0 denotes an etching rate of the semiconductor wafer W when the candidate period (i.e., the voltage stop period A1$a$) is zero (0), and ER indicates an etching rate of the semiconductor wafer W when the candidate period (i.e., the voltage stop period A1$a$) is other than zero (0).

Subsequently, based on the data indicating the relationship between the etching rate reduction ratios and the candidate periods, the control unit 94 selects a candidate period which allows the etching rate reduction ratio to be equal to or less than a preset tolerance value, and corrects the voltage stop period A1$a$ to the selected candidate period.

As stated above, in the plasma etching apparatus 1 according to the exemplary embodiment, the second calibration process, in which the voltage stop period A1$a$ is corrected to the candidate period that allows the etching rate reduction ratio to be equal or less than the preset tolerance value, is performed. Accordingly, it is possible to set the upper limit of the voltage stop period A1$a$ such that the degree of the reduction of the etching rate is suppressed. As a result, it is possible to maintain a required etching rate while suppressing the electric discharge in the upper electrode 34.

Furthermore, the exemplary embodiment has been described for the case where the control unit 94 performs the second calibration process, it is also possible for a user of the plasma etching apparatus 1 to perform a part of or the whole of the second calibration process.

FIG. 8A is a diagram illustrating an example of experimental results indicating a relationship between a plurality of candidate periods as candidates of the voltage stop period A1$a$ and etching rate reduction ratios corresponding to the candidate periods. In FIG. 8A, "Film type" indicates a target film on the semiconductor wafer W to be etched. "Poly" indicates a polysilicon film, and "Ox" indicates an SiO$_2$ film. Further, "ON time" indicates the period A1 (μsec) during which the high frequency power is supplied to the lower electrode 16. Further, "Delay time" indicates the plurality of candidate periods (μsec) as candidates of the voltage stop period A1$a$, and "Voltage stop period ratio" indicates a ratio (%) of the voltage stop period A1$a$ with respect to the period A1. Further, "E/R" indicates the etching rate (nm/min) of the semiconductor wafer W. Furthermore, "E/R reduction ratio" indicates the etching rate reduction ratio (%) corresponding to the candidate period.

Further, in FIG. 8A, as processing conditions, the frequencies of the first high frequency power and the second high frequency power are set to be 10 kHz, and the duty ratios of the first high frequency power and the second high frequency power are set to be 60%.

FIG. 8B is a diagram for describing a relationship between the voltage stop period ratio and the etching rate shown in FIG. 8A, and FIG. 8C is a diagram for describing a relationship between the voltage stop period ratio and the etching rate reduction ratio shown in FIG. 8A. In each of FIG. 8B and FIG. 8C, a horizontal axis represents a voltage stop period ratio (%). Further, in FIG. 8B, a left vertical axis indicates the etching rate (nm/min) of the SiO$_2$ film on the semiconductor wafer W, and a right vertical axis indicates the etching rate (nm/min) of the polysilicon film on the semiconductor wafer W. Furthermore, in FIG. 8C, a left vertical axis indicates the etching rate reduction ratio (%) of the SiO$_2$ film on the semiconductor wafer W, and a right vertical axis indicates the etching rate reduction ratio (%) of the polysilicon film on the semiconductor wafer W.

Furthermore, in FIG. 8B, a graph 601 is a graph of the etching rate of the polysilicon film on the semiconductor wafer W, and a graph 602 is a graph of the etching rate of the SiO$_2$ film on the semiconductor wafer W. Further, in FIG. 8C, a graph 701 is a graph of the etching rate reduction ratio of the polysilicon film on the semiconductor wafer W, and a graph 702 is a graph of the etching rate reduction ratio of the SiO$_2$ film on the semiconductor wafer W.

As depicted in FIG. 8A and FIG. 8B, when the voltage stop period ratio is zero (0) (that is, when the voltage stop period A1$a$ is not set), the etching rates of the polysilicon film and the SiO$_2$ film are both maximum, and as the voltage stop period ratio increases from zero (0), the etching rates of both the polysilicon film and the SiO$_2$ film decrease.

As can be seen from FIG. 8A and FIG. 8C, as the voltage stop period ratio increases from zero (0), the etching rate reduction ratios of both the polysilicon film and the SiO$_2$ film increase. Furthermore, the etching rate reduction ratios of the polysilicon film and the SiO$_2$ film are almost equal.

From the experimental results of FIG. 8A to FIG. 8C, it is found out that if the voltage stop period ratio is equal to or less than 40%, the etching rate reduction ratios of the polysilicon film and the SiO$_2$ film are suppressed to about 6% or less. Therefore, it is desirable that the voltage stop period ratio, i.e., the ratio of the voltage stop period A1$a$ with respect to the period A1 during which the high frequency power is being supplied to the lower electrode 16 is equal to or less than 40%. Thus, in the exemplary embodiment, the control unit 94 selects a candidate period that allows the etching rate reduction ratio to be equal to or less than 6%, which is the preset tolerance value, and corrects the voltage stop period A1$a$ to the selected candidate period. Accordingly, it is possible to maintain a required etching rate while suppressing the electric discharge in the upper electrode 34.

Now, presence or absence of the electric discharge in case of varying the second high frequency power in the power supply control process according to the exemplary embodiment will be explained. FIG. 9 is a diagram illustrating an example of presence or absence of the electric discharge when the second high frequency power is varied in the power supply control process according to the exemplary embodiment. In FIG. 9, "DC On delay 15 μs" indicates a result of investigating presence or absence of the electric discharge in case of changing the second high frequency power from 12 kW to 15 kW in the power supply control process according to the exemplary embodiment. Further, "STD DC power supply" indicate a result of investigating presence or absence of the electric discharge in case of changing the second high frequency power from 12 kW to 15 kW in the power supply control process in the comparative example. Furthermore, in case of "DC On delay 15 μs," the voltage stop period A1$a$ is set to 15 μsec, and in case of "STD DC power supply," the voltage stop period A1$a$ is not set. Further, in both cases of "DC On delay 15 μs" and "STD DC power supply," "x" indicates the Vpp variation ratio exceeds the preset tolerance value of 2.0%, that is, the electric discharge has occurred. Further, "O" indicates that the Vpp variation ratio is equal to or less than the preset tolerance value of 2.0%, that is, no electric discharge has occurred.

Furthermore, in FIG. 9, as other processing conditions, the processing gas of $C_4F_6/C_4F_8/O_2/Ar/C_4F_6$=85 sccm/88 sccm/170 sccm/400 sccm/5 sccm is used; a the first high frequency power from the first high frequency power supply 92 is set to 2000 W; frequencies of the first high frequency power and the second high frequency power are set to be in the range from 4 kHz to 10 kHz; duty ratios of the first high frequency power and the second high frequency powers are set to be in the range from 20% to 60%; DC voltages applied to the upper electrode 34 is set to be (first DC voltage V1)/(second DC voltage V2)=−500 V/−1000 V; and the processing time is set to be 60 sec.

As shown in FIG. 9, in case of "DC On delay 15 μs," occurrence of the electric discharge is suppressed, as compared to the case of "STD DC power supply." That is, as can be found out from the result of FIG. 9, it is possible to increase the second high frequency power by setting the voltage stop period A1a in the power supply control process according to the exemplary embodiment.

Figure 10:
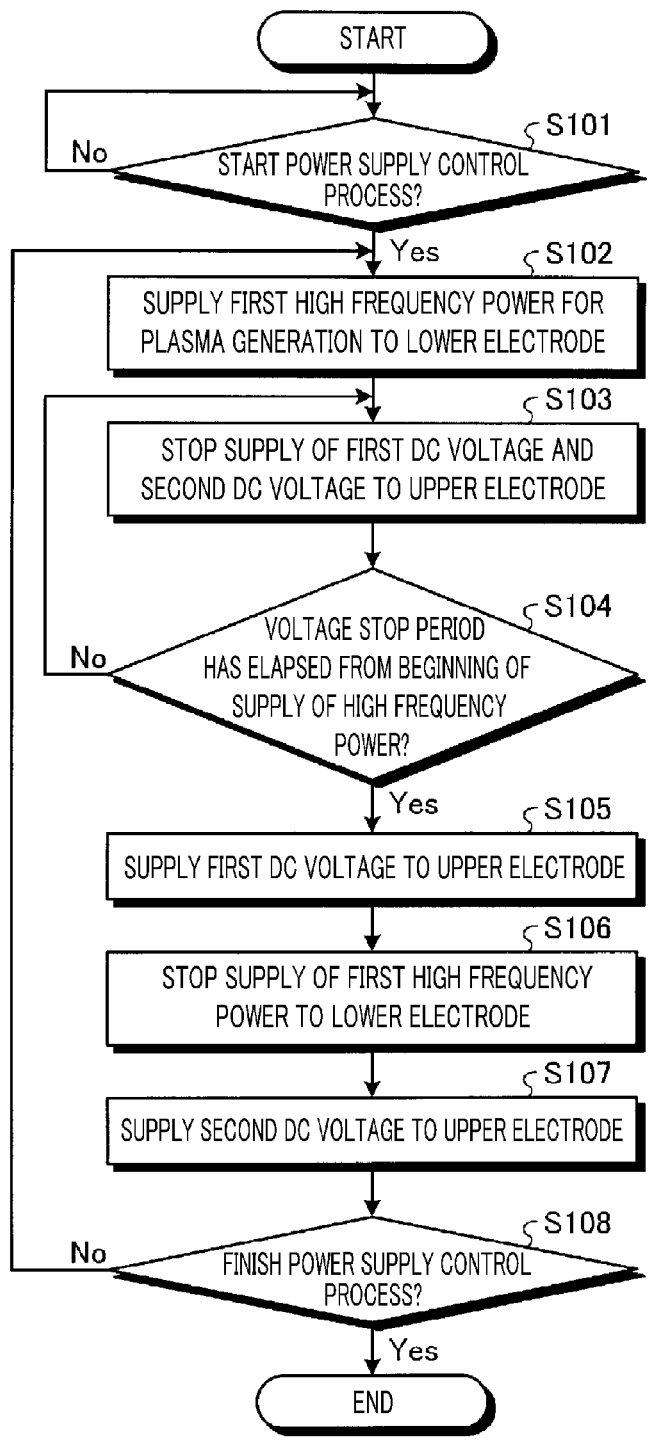
FIG. 10 is a flowchart illustrating an example flow of the power supply control process according to the exemplary embodiment.

Now, an example flow of the power supply control process performed in the plasma etching apparatus 1 shown in FIG. 1 will be explained. FIG. 10 is a flowchart for describing an example flow of the power supply control process according to the exemplary embodiment.

As shown in FIG. 10, if it is time for starting the power supply control process (process S101; Yes), the semiconductor wafer W, for example, is loaded into the processing vessel 10 to be placed on the lower electrode 16, and the inside of the processing vessel 10 is evacuated by the vacuum pump of the gas exhaust device 84. Further, the processing gas is supplied into the processing vessel 10 from the processing gas supply unit 66. Then, the control unit 94 supplies the first high frequency power for plasma generation to the lower electrode 16 (process S102). Further, the control unit 94 also supplies the second high frequency power for ion attraction to the lower electrode 16.

During the voltage stop period A1a within the period A1 during which the high frequency powers are being supplied, the control unit 94 stops the supply of the first DC voltage V1 and the supply of the second DC voltage V2 to the upper electrode 34 (process S103).

If the voltage stop period A1a has not elapsed from the beginning of the supply of the high frequency powers (process S104: No), the control unit 94 returns the process back to process S103.

Meanwhile, if the voltage stop period A1a has elapsed from the beginning of the supply of the high frequency powers (process S104; Yes), the control unit 94 supplies the first DC voltage V1 to the upper electrode 34 during the period A1b except the voltage stop period A1a within the period A1 (process S105).

The control unit 94 stops the supply of the first high frequency power for plasma generation to the lower electrode 16 (process S106). Further, the control unit 94 also stops the supply of the second high frequency power for ion attraction to the lower electrode 16.

The control unit 94 supplies the second DC voltage V2 to the upper electrode 34 for the period A2 during which the supply of the high frequency powers is stopped (process S107).

If it is not time for finishing the power supply control process (process S108; No), the control unit 94 returns the process to process S102, and if it is time for finishing the power supply control process (process S108; Yes), the control unit 94 finishes the power supply control process.

Figure 11:
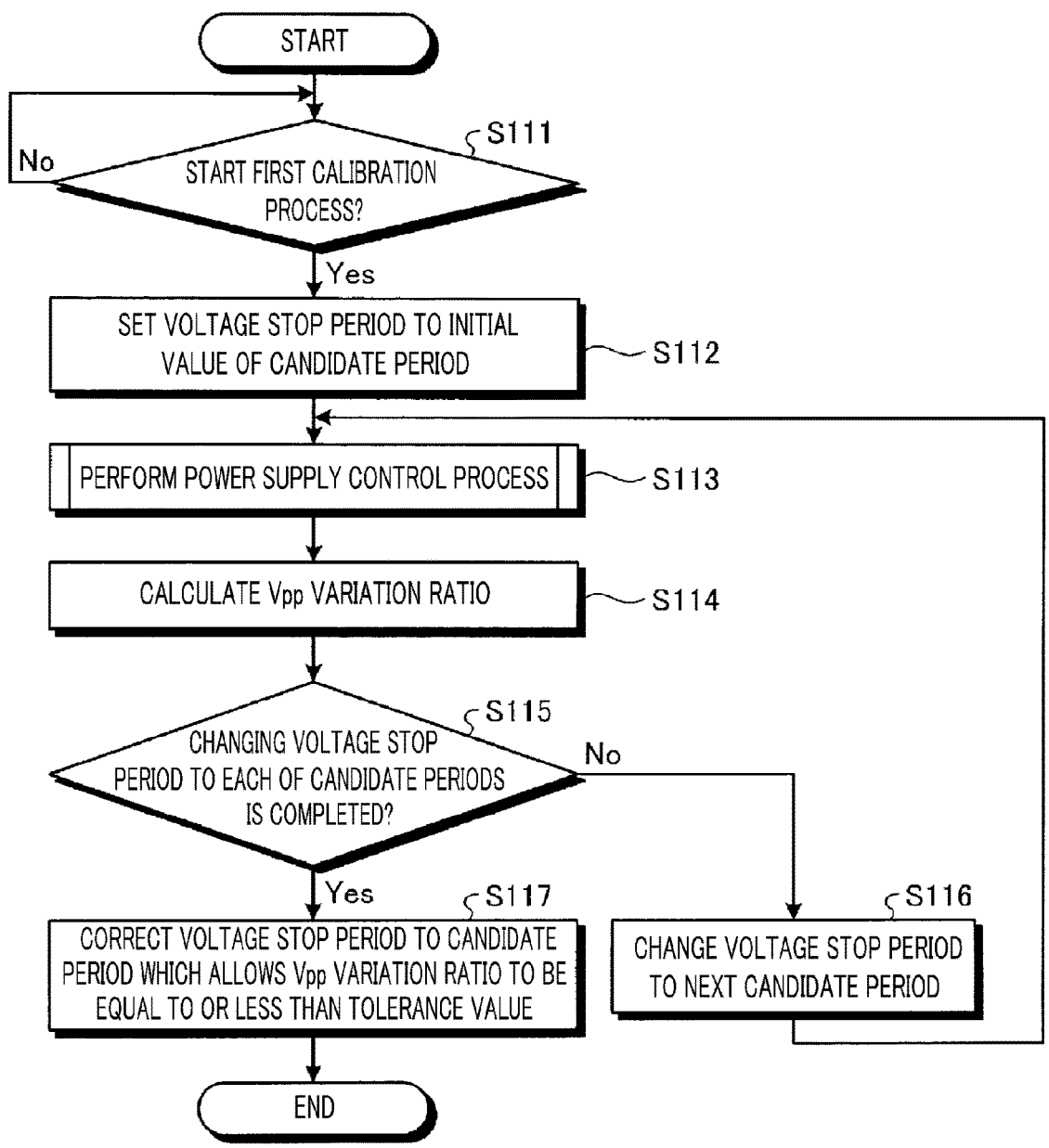
FIG. 11 is a flowchart illustrating an example flow of a first calibration process according to the exemplary embodiment.

Now, an example flow of the first calibration process performed in the plasma etching apparatus 1 shown in FIG. 1 will be explained. FIG. 11 is a flowchart for describing an example flow of the first calibration process according to the exemplary embodiment. Further, the first calibration process shown in FIG. 11 is performed by using a dummy wafer instead of the exemplary semiconductor wafer W prior to starting the power supply control process shown in FIG. 10, for example.

As depicted in FIG. 11, if it is time for starting the first calibration process (process S111; Yes), the control unit 94 sets the voltage stop period A1a to the initial value of the candidate periods (process S112). Then, the control unit 94 performs the power supply control process shown in FIG. 10 (process S113).

The control unit 94 calculates the Vpp variation ratio (process S114). If it is not completed to change the voltage stop period A1a to each of the candidate periods (process S115; No), the control unit 94 changes the voltage stop period A1a to a next candidate period (process S116), and returns the process back to process S113.

Meanwhile, if the changing of the voltage stop period A1a to each of the candidate periods is completed (process S115; Yes), the control unit 94 selects the candidate period that allows the Vpp variation ratio to be equal to or less than the preset tolerance value, and corrects the voltage stop period A1a to the selected candidate period (process S117).

Figure 12:
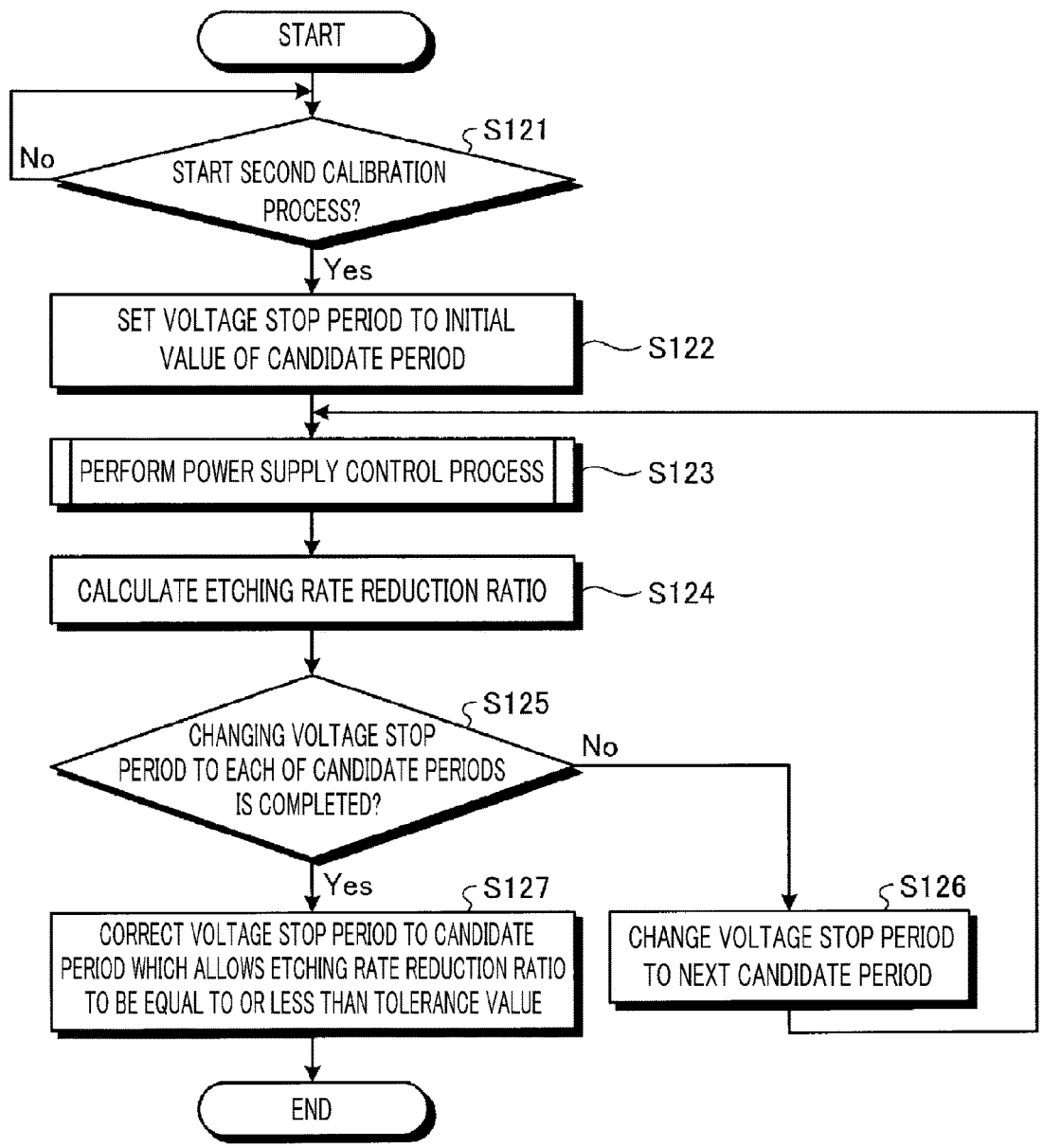
FIG. 12 is a flowchart illustrating an example flow of a second calibration process according to the exemplary embodiment.

Now, an example flow of the second calibration process performed in the plasma etching apparatus 1 shown in FIG. 1 will be explained. FIG. 12 is a flowchart for describing an example flow of the second calibration process according to the exemplary embodiment. Further, the second calibration process shown in FIG. 12 is performed prior to starting the power supply control process shown in FIG. 10, for example.

As depicted in FIG. 12, if it is time for starting the second calibration process (process S121; Yes), the control unit 94 sets the voltage stop period A1a to the initial value of the candidate periods (process S122). Then, the control unit 94 performs the power supply control process shown in FIG. 10 (process S123).

The control unit 94 calculates the etching rate reduction ratio (process S124). If it is not completed to change the voltage stop period A1a to each of the candidate periods (process S125; No), the control unit 94 changes the voltage stop period A1a to a next candidate period (process S126), and returns the process back to process S123.

Meanwhile, if the changing of the voltage stop period A1a to each of the candidate periods is completed (process S125: Yes), the control unit 94 selects the candidate period that allows the etching rate reduction ratio to be equal to or less than the preset tolerance value, and corrects the voltage stop period A1a to the selected candidate period (process S127).

Further, a part of or the whole of the second calibration process depicted in FIG. 12 may be performed by a user of the plasma etching apparatus 1.

As stated above, the plasma etching apparatus 1 according to the exemplary embodiment performs the power supply control process in which the supply of the high frequency power and the stop of the supply of this high frequency powers are repeated alternately; the supply of the first DC voltage V1 and the second DC voltage V2 are stopped during the voltage stop period A1, which is the preset time period from the beginning of the supply of the high frequency powers within the period A1 while the high frequency powers are being supplied; the first DC voltage V1 is supplied during the period A1b except the voltage stop period A1a within the period A1; and the second DC voltage V2 is supplied during the period A2 during which the supply of the high frequency powers is stopped. Accordingly, it is possible to suppress the electrons from being bounced off the plasma sheath generated on the semiconductor wafer W, which is accompanied by supplying the high frequency powers to the lower electrode 16. As a result, according to the plasma etching apparatus 1 of the present exemplary embodiment, it is possible to suppress the electric discharge in the upper electrode 34.

Furthermore, in the plasma etching apparatus 1 according to the exemplary embodiment, the first calibration process, in which the voltage stop period A1a is corrected to the candidate period which allows the Vpp variation ratio indicating the degree of the variation of the Vpp value to be equal to or less than the preset tolerance value, is performed. Accordingly, it is possible to correct the voltage stop period A1a to the appropriate time period when the growth of the plasma sheath on the semiconductor wafer W is completed. Therefore, it is possible to certainly avoid bouncing of the electrons by the plasma sheath which is growing on the semiconductor wafer W in the direction approaching the upper electrode 34. As a result, the electric discharge in the upper electrode 34 can be securely suppressed during the voltage stop period A1a.

Moreover, in the plasma etching apparatus 1 according to the exemplary embodiment, the second calibration process, in which the voltage stop period A1a is corrected to the candidate period that allows the etching rate reduction ratio to be equal or less than the preset tolerance value, is performed. Accordingly, it is possible to set the upper limit of the voltage stop period A1a such that the degree of the reduction of the etching rate is suppressed. As a result, it is possible to maintain the required etching rate while suppressing the electric discharge in the upper electrode 34.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A power supply system, comprising:
   a first high frequency power supply configured to supply a high frequency power for plasma generation to a lower electrode configured to mount a processing target object thereon;
   a DC power supply configured to supply a first negative DC voltage or a second negative DC voltage having an absolute value larger than that of the first DC voltage to an upper electrode provided to face the lower electrode; and
   a control unit configured to perform a power supply control process of repeating a supply of the high frequency power and a stop of the supply of the high frequency power alternately; stopping a supply of the first DC voltage and a supply of the second DC voltage for a first period, which is a time period from a beginning of the supply of the high frequency power within a period during which the high frequency power is being supplied; supplying the first DC voltage for a second period except the first period within the period during which the high frequency power is being supplied; and supplying the second DC voltage for a period during which the supply of the high frequency power is stopped.

2. The power supply system of claim 1, further comprising:
   a second high frequency power supply configured to supply a high frequency power for ion attraction, which is different from the high frequency power for plasma generation, to the lower electrode; and
   a Vpp measuring unit configured to measure a Vpp value which is an amplitude value of a voltage corresponding to the high frequency power for ion attraction,
   wherein the control unit is further configured to perform a first calibration process of performing the power supply control process while changing the first period to a plurality of candidate periods as candidates of the first period; calculating a Vpp variation ratio indicating a degree of variation of the Vpp value for each of the candidate periods; selecting, among the candidate periods, a candidate period which allows the Vpp variation ratio to be equal to or less than a preset tolerance value; and correcting the first period to the selected candidate period.

3. The power supply system of claim 1, further comprising:
   an etching rate acquiring unit configured to acquire an etching rate of the processing target objet,
   wherein the control unit is further configured to perform a second calibration process of performing the power supply control process while changing the first period to a plurality of candidate periods as candidates of the first period; calculating an etching rate reduction ratio indicating a degree of reduction of the etching rate for each of the candidate periods; selecting a candidate period which allows the etching rate reduction ratio to be equal to or less than a predetermined tolerance value; and correcting the first period to the selected candidate period.

4. The power supply system of claim 1,
   wherein a ratio of the first period with respect to the period during which the high frequency power is being supplied is equal to or less than 40%.

5. The power supply system of claim 1,
   wherein the first period is equal to or longer than 5 μsec.

6. The power supply system of claim 1,
   wherein the DC power supply comprises:
   a first DC power supply unit configured to supply the first DC voltage;
   a second DC power supply unit configured to supply the second DC voltage;
   a selecting circuit configured to selectively connect the first DC power supply unit and the second DC power supply unit to the upper electrode; and
   a discharging circuit connected to a connection point between the selecting circuit and the upper electrode via a switching circuit,
   wherein the control unit is further configured to, when performing the power supply control process, control the selecting circuit to disconnect the upper electrode from the first and second DC power supply units and control the switching circuit to connect the discharging circuit to the connection point for the first period within the period during which the high frequency power is being supplied; and control the selecting circuit to connect the first DC power supply unit to the upper electrode for the second period; and control the selecting circuit to connect the second DC power supply unit to the upper electrode for the period during which the supply of the high frequency power is stopped.

7. A plasma processing apparatus, comprising:
a processing vessel;
a gas supply unit configured to supply a processing gas into the processing vessel;
a lower electrode which is provided within the processing vessel and configured to mount a processing target object thereon;
an upper electrode provided within the processing vessel to face the lower electrode; and
a power supply system,
wherein the power supply system includes:
a high frequency power supply configured to supply a high frequency power for plasma generation to the lower electrode;
a DC power supply configured to supply a first negative DC voltage or a second negative DC voltage having an absolute value larger than that of the first DC voltage to the upper electrode; and
a control unit configured to perform a power supply control process of repeating a supply of the high frequency power and a stop of the supply of the high frequency power alternately; stopping a supply of the first DC voltage and a supply of the second DC voltage for a first period, which is a time period from a beginning of the supply of the high frequency power within a period during which the high frequency power is being supplied; supplying the first DC voltage for a second period except the first period within the period during which the high frequency power is being supplied; and supplying the second DC voltage for a period during which the supply of the high frequency power is stopped.

8. A power supply control method performed in a power supply system including a high frequency power supply configured to supply a high frequency power for plasma generation to a lower electrode configured to mount a processing target object thereon; and a DC power supply configured to supply a first negative DC voltage or a second negative DC voltage having an absolute value larger than that of the first DC voltage to an upper electrode provided to face the lower electrode, the method comprising:
performing a power supply control process of repeating a supply of the high frequency power and a stop of the supply of the high frequency power alternately; stopping a supply of the first DC voltage and a supply of the second DC voltage for a first period, which is a time period from a beginning of the supply of the high frequency power within a period during which the high frequency power is being supplied; supplying the first DC voltage for a second period except the first period within the period during which the high frequency power is being supplied; and supplying the second DC voltage for a period during which the supply of the high frequency power is stopped.

9. The power supply control method of claim 8, further comprising:
acquiring an etching rate of the processing target object; and
performing a calibration process of performing the power supply control process while changing the first period to a plurality of candidate periods as candidates of the first period; calculating an etching rate reduction ratio indicating a degree of reduction of the etching rate for each of the candidate periods; selecting a candidate period which allows the etching rate reduction ratio to be equal to or less than a tolerance value; and correcting the first period to the selected candidate period.

* * * * *

UNITED STATES PATENT AND TRADEMARK OFFICE
CERTIFICATE OF CORRECTION

PATENT NO. : 10,056,230 B2
APPLICATION NO. : 15/075505
DATED : August 21, 2018
INVENTOR(S) : Taichi Hirano et al.

Page 1 of 1

It is certified that error appears in the above-identified patent and that said Letters Patent is hereby corrected as shown below:

In the Specification

Column 15, Line 52, "51" should be -- S1 --.

Column 15, Line 53, "51" should be -- S1 --.

Column 15, Line 55, "51" should be -- S1 --.

Signed and Sealed this
Sixth Day of November, 2018

Andrei Iancu
*Director of the United States Patent and Trademark Office*